United States Patent
Mason et al.

(10) Patent No.: US 10,741,951 B2
(45) Date of Patent: Aug. 11, 2020

(54) SOCKET CONNECTOR ASSEMBLY FOR AN ELECTRONIC PACKAGE

(71) Applicants: TE CONNECTIVITY CORPORATION, Berwyn, PA (US); TYCO ELECTRONICS JAPAN G.K., Kawasaki-shi (JP)

(72) Inventors: Jeffery Walter Mason, North Attleboro, MA (US); Takeshi Nakashima, Kanagawa (JP); Naoki Hashimoto, Tokyo (JP)

(73) Assignees: TE Connectivity Corporation, Berwyn, PA (US); Tyco Electronics Japan G.K. (JP)

( * ) Notice: Subject to any disclaimer, the term of this patent is extended or adjusted under 35 U.S.C. 154(b) by 0 days.

(21) Appl. No.: 15/941,615

(22) Filed: Mar. 30, 2018

(65) Prior Publication Data

US 2019/0148859 A1 May 16, 2019

Related U.S. Application Data

(60) Provisional application No. 62/585,268, filed on Nov. 13, 2017, provisional application No. 62/632,383, filed on Feb. 19, 2018.

(51) Int. Cl.
*H01R 12/00* (2006.01)
*H01R 12/82* (2011.01)
(Continued)

(52) U.S. Cl.
CPC ............ *H01R 12/82* (2013.01); *G06F 1/184* (2013.01); *H01R 12/52* (2013.01); *H01R 12/585* (2013.01);
(Continued)

(58) Field of Classification Search
CPC .................... H01R 12/7076; H01R 12/57
(Continued)

(56) References Cited

U.S. PATENT DOCUMENTS 4,356,532 A * 10/1982 Donaher ............... H05K 1/141
174/541
4,997,378 A * 3/1991 Matsuoka .......... H01R 13/2442
439/71
(Continued)

FOREIGN PATENT DOCUMENTS

CN       102437446 A    5/2012
WO    WO 2016/112379 A1    7/2016

OTHER PUBLICATIONS

SIPO First Office Action and Search Report for CN 201811345091.7 (counterpart of TE-00078-US), and English translation.

*Primary Examiner* — Neil Abrams

(57) ABSTRACT

A socket connector includes a socket assembly having a socket substrate and socket contacts. The socket substrate has first and second upper mating areas and a first lower mating area. The socket substrate has first and second socket substrate conductors at the first and second upper mating areas, respectively, and third socket substrate conductors at the first lower mating area electrically connected to corresponding first socket substrate conductors. The first socket substrate conductors are electrically connected to an electronic package, the second socket substrate conductors are electrically connected to an electrical component and the third socket substrate conductors are electrically connected to a host circuit board. The socket assembly is configured to electrically connect the electronic package with both the host circuit board and the electrical component. The socket contacts have a terminating end terminated to corresponding first socket substrate conductors and a mating end mated to package contacts.

26 Claims, 11 Drawing Sheets

(51) Int. Cl.
| | | |
|---|---|---|
| *H05K 7/10* | (2006.01) | |
| *G06F 1/18* | (2006.01) | |
| *H05K 3/34* | (2006.01) | |
| *H01R 43/02* | (2006.01) | |
| *H01R 13/11* | (2006.01) | |
| *H01R 12/52* | (2011.01) | |
| *H01R 12/58* | (2011.01) | |
| *H01R 12/61* | (2011.01) | |
| *H01R 12/70* | (2011.01) | |
| *H01R 12/79* | (2011.01) | |
| *H01R 12/85* | (2011.01) | |
| *H01R 13/24* | (2006.01) | |
| *H05K 1/02* | (2006.01) | |
| *H05K 1/11* | (2006.01) | |
| *H05K 1/18* | (2006.01) | |
| *H01R 13/05* | (2006.01) | |
| *H01R 12/71* | (2011.01) | |
| *H01L 23/40* | (2006.01) | |

(52) U.S. Cl.
CPC .......... *H01R 12/61* (2013.01); *H01R 12/7005* (2013.01); *H01R 12/7076* (2013.01); *H01R 12/79* (2013.01); *H01R 12/85* (2013.01); *H01R 13/057* (2013.01); *H01R 13/11* (2013.01); *H01R 13/111* (2013.01); *H01R 13/2442* (2013.01); *H01R 43/0256* (2013.01); *H05K 1/0203* (2013.01); *H05K 1/0243* (2013.01); *H05K 1/115* (2013.01); *H05K 1/181* (2013.01); *H05K 3/3436* (2013.01); *H05K 7/1084* (2013.01); *H01L 23/4006* (2013.01); *H01L 2023/405* (2013.01); *H01L 2023/4031* (2013.01); *H01L 2023/4062* (2013.01); *H01L 2023/4081* (2013.01); *H01L 2023/4087* (2013.01); *H01R 12/716* (2013.01); *H01R 13/2464* (2013.01); *H05K 2201/044* (2013.01); *H05K 2201/066* (2013.01); *H05K 2201/10325* (2013.01); *H05K 2201/10393* (2013.01); *H05K 2201/10704* (2013.01); *H05K 2201/10719* (2013.01); *H05K 2201/10734* (2013.01)

(58) Field of Classification Search
USPC .................................. 439/70, 71, 620.2, 862
See application file for complete search history.

(56) References Cited

U.S. PATENT DOCUMENTS

| | | | |
|---|---|---|---|
| 5,046,954 A | 9/1991 | Schmedding | |
| 5,152,695 A * | 10/1992 | Grabbe | H01R 13/245 439/66 |
| 5,176,524 A * | 1/1993 | Mizuno | H05K 1/141 439/329 |
| 5,383,787 A | 1/1995 | Switky et al. | |
| 5,403,195 A * | 4/1995 | Thrush | H01R 13/6625 439/620.2 |
| 5,499,929 A | 3/1996 | Miyazawa | |
| 5,655,913 A * | 8/1997 | Castaneda | H01R 12/57 439/66 |
| 5,783,865 A | 7/1998 | Higashiguchi et al. | |
| 5,791,928 A | 8/1998 | Lai | |
| 5,929,521 A | 7/1999 | Wark et al. | |
| 5,967,848 A * | 10/1999 | Johnson | H01L 23/64 439/620.21 |
| 6,007,348 A | 12/1999 | Murphy | |
| 6,046,465 A * | 4/2000 | Wang | H01L 33/10 117/104 |
| 6,050,829 A * | 4/2000 | Eldridge | G01R 1/07378 324/754.07 |
| 6,213,787 B1 | 4/2001 | Murphy | |
| 6,257,904 B1 * | 7/2001 | Lin | H05K 1/141 439/67 |
| 6,347,946 B1 * | 2/2002 | Trobough | G01R 1/0416 361/790 |
| 6,425,771 B1 | 7/2002 | Shirai et al. | |
| 6,575,766 B1 | 6/2003 | Xie et al. | |
| 6,674,018 B2 * | 1/2004 | Yumi | H05K 1/0215 174/261 |
| 6,833,613 B1 | 12/2004 | Akram et al. | |
| 6,923,656 B2 * | 8/2005 | Novotny | H05K 7/1061 439/66 |
| 6,992,899 B2 | 1/2006 | Alger et al. | |
| 7,053,496 B2 | 5/2006 | Stone | |
| 6,992,496 B2 | 7/2006 | Winter et al. | |
| 7,148,428 B2 | 12/2006 | Meier et al. | |
| 7,156,705 B2 * | 1/2007 | Soh | H01R 13/2442 439/71 |
| 7,177,142 B2 | 2/2007 | Kabadi et al. | |
| 7,200,295 B2 | 4/2007 | Rolston et al. | |
| 7,280,372 B2 | 10/2007 | Grundy et al. | |
| 7,306,494 B2 * | 12/2007 | Soh | H01R 12/57 439/862 |
| 7,307,293 B2 | 12/2007 | Fjelstad et al. | |
| 7,393,214 B2 | 7/2008 | Di Stefano | |
| 7,394,665 B2 | 7/2008 | Hamasaki et al. | |
| 7,435,102 B2 | 10/2008 | Goodman | |
| 7,442,045 B1 | 10/2008 | Di Stefano | |
| 7,527,529 B2 * | 5/2009 | Ho | H01R 12/57 439/660 |
| 7,601,009 B2 | 10/2009 | Di Stefano | |
| 7,652,381 B2 | 1/2010 | Grundy et al. | |
| 7,695,287 B2 | 4/2010 | Smith et al. | |
| 7,744,385 B2 | 6/2010 | Scherer | |
| 7,744,414 B2 | 6/2010 | Scherer et al. | |
| 7,750,446 B2 | 7/2010 | Fjelstad et al. | |
| 7,811,096 B2 | 10/2010 | Takagi | |
| 7,874,880 B2 | 1/2011 | Fedde et al. | |
| 7,909,616 B2 | 3/2011 | Liao | |
| 7,955,088 B2 | 6/2011 | Di Stefano | |
| 8,018,733 B2 | 9/2011 | Jia | |
| 8,079,849 B2 | 12/2011 | MacDougall et al. | |
| 8,167,644 B2 | 5/2012 | Mason et al. | |
| 8,172,615 B2 * | 5/2012 | Mason | H01R 12/714 439/108 |
| 8,206,188 B1 * | 6/2012 | Zhang | H01R 13/2442 439/862 |
| 8,277,255 B2 * | 10/2012 | Consoli | H01R 12/7076 439/620.2 |
| 8,338,713 B2 | 12/2012 | Fjelstad et al. | |
| 8,575,529 B2 | 11/2013 | Asahi et al. | |
| 8,592,692 B2 * | 11/2013 | Sharf | H05K 1/0251 174/266 |
| 8,708,729 B2 * | 4/2014 | An | H01R 12/79 439/331 |
| 8,727,808 B2 | 5/2014 | Mason et al. | |
| 8,727,815 B1 * | 5/2014 | Mongold | H01R 43/205 439/751 |
| 8,804,342 B2 | 8/2014 | Behziz et al. | |
| 8,821,198 B2 * | 9/2014 | Harada | H01R 12/57 439/66 |
| 8,827,730 B2 * | 9/2014 | Ihara | H01R 12/714 439/206 |
| 8,867,231 B2 * | 10/2014 | Roitberg | H01L 23/50 361/729 |
| 8,968,010 B2 * | 3/2015 | Endo | H01R 4/48 439/82 |
| 9,252,521 B1 * | 2/2016 | Beaman | H01R 13/2442 |
| 9,274,295 B2 | 3/2016 | Droesbeke | |
| 9,426,918 B2 * | 8/2016 | Bet-Shliemoun | H05K 7/1092 |
| 9,504,159 B2 | 11/2016 | Lee et al. | |
| 9,531,133 B1 | 12/2016 | Horning et al. | |
| 9,692,147 B1 * | 6/2017 | Nekkanty | H05K 5/0086 |
| 9,761,520 B2 | 9/2017 | Rathburn | |
| 9,947,634 B1 | 4/2018 | Wang | |
| 10,079,443 B2 | 9/2018 | Costello et al. | |
| 10,135,211 B2 | 11/2018 | Lloyd et al. | |
| 10,348,015 B2 | 7/2019 | Mason et al. | |

(56) References Cited

U.S. PATENT DOCUMENTS

| | | |
|---|---|---|
| 2004/0080921 A1 | 4/2004 | Paola |
| 2005/0070131 A1 | 3/2005 | McLenaghan |
| 2006/0001163 A1 | 1/2006 | Kolbehdari et al. |
| 2006/0292898 A1 | 12/2006 | Meredith et al. |
| 2010/0197151 A1 | 8/2010 | Bet-Shliemoun |
| 2010/0297857 A1 | 11/2010 | Ito |
| 2011/0207344 A1 | 8/2011 | McColloch |
| 2011/0287639 A1 | 11/2011 | Hsu |
| 2013/0182394 A1 | 7/2013 | Roitberg et al. |
| 2014/0073173 A1 | 3/2014 | Yang |
| 2014/0148058 A1 | 5/2014 | Mongold et al. |
| 2014/0273551 A1 | 9/2014 | Resendez et al. |
| 2015/0079815 A1 | 3/2015 | Leigh et al. |
| 2016/0233615 A1 | 8/2016 | Scholeno |
| 2017/0302036 A1 | 10/2017 | Regnier et al. |
| 2018/0226735 A1 | 8/2018 | Leigh et al. |
| 2018/0287276 A1 | 10/2018 | Taguchi |
| 2018/0287279 A1 | 10/2018 | Taguchi |

\* cited by examiner

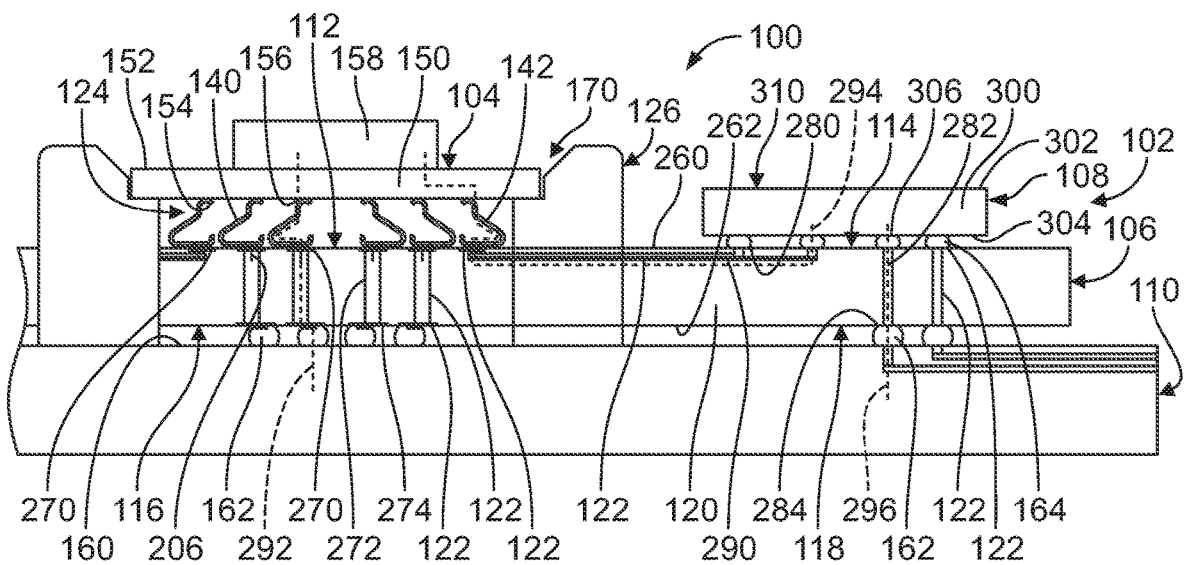
FIG. 5
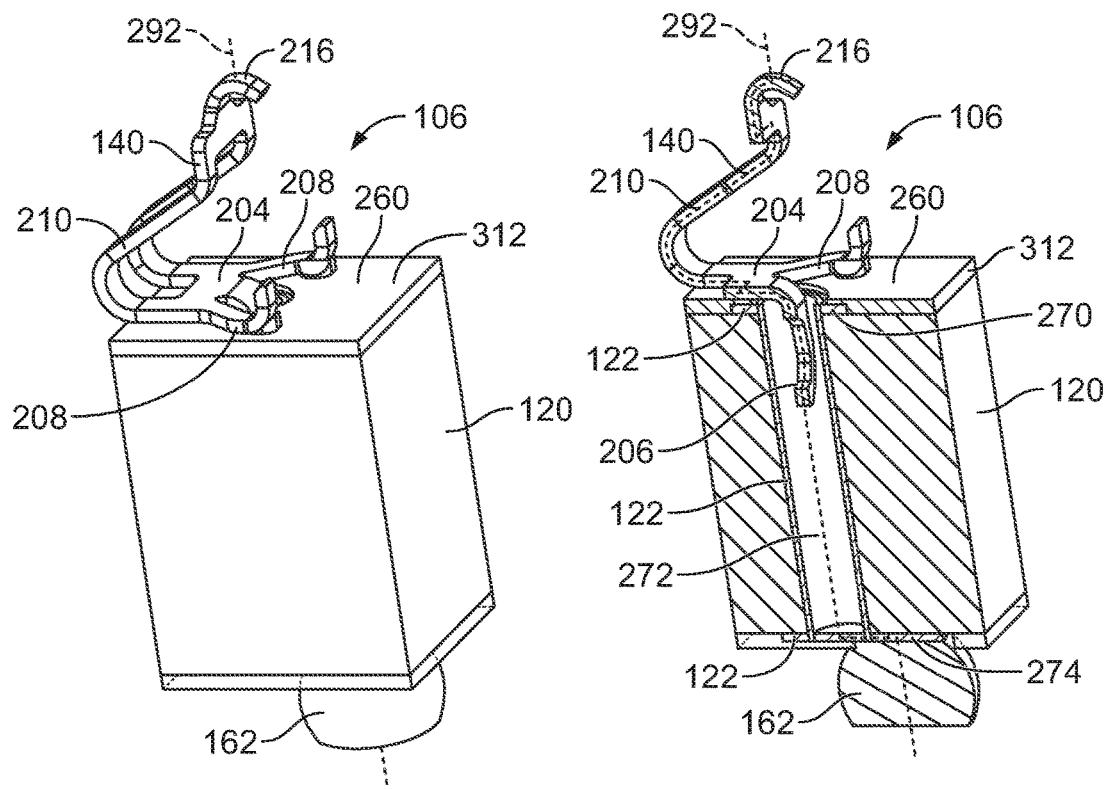
FIG. 6
FIG. 7

SOCKET CONNECTOR ASSEMBLY FOR AN ELECTRONIC PACKAGE

CROSS REFERENCE TO RELATED APPLICATIONS

This application claims benefit to U.S. Provisional Application No. 62/585,268, filed Nov. 13, 2017, titled "CABLE SOCKET CONNECTOR ASSEMBLY FOR AN ELECTRONIC PACKAGE" and claims benefit to U.S. Provisional Application No. 62/632,383, filed Feb. 19, 2018, titled "SOCKET CONNECTOR FOR AN ELECTRONIC PACKAGE", the subject matter of each are herein incorporated by reference in their entirety.

BACKGROUND OF THE INVENTION

The subject matter herein relates generally to socket connector assemblies for an electronic package of an electronic system.

The ongoing trend toward smaller, lighter, and higher performance electrical components and higher density electrical circuits has led to the development of surface mount technology in the design of printed circuit boards and electronic packages. Surface mountable packaging allows for a separable connection of an electronic package, such as an integrated circuit or a computer processor, to pads on the surface of the circuit board rather than by contacts or pins soldered in plated holes going through the circuit board. Surface mount technology may allow for an increased component density on a circuit board, thereby saving space on the circuit board.

One form of surface mount technology includes socket connectors. A socket connector may include a substrate with terminals on one side of the substrate and an array of conductive solder elements, such as a ball grid array (BGA), on the opposite side, electrically connected through the substrate by conductive pathways through the substrate. The terminals engage contacts on the electronic package and the solder elements are affixed to conductive pads on a host circuit board, such as a mother board, to electrically join the electronic package with the host circuit board. Conventional architecture provides the socket connector between the electronic package and the host circuit board. Electrical paths are defined through the socket connector to the host circuit board to drive signals from the bottom of the electronic package, through the socket connector into the host circuit board. Such electrical paths are then routed to an electrical connector mounted at a separate location on the host circuit board, such as a high speed electrical connector. The routing of the circuits between the socket connector and the high speed electrical connector on the host circuit board occupies board space on the host circuit board. Additionally, the electrical performance of the electronic system is reduced by the multiple electrical interfaces between the electronic package and the high speed connector on the host circuit board. Conventional systems are struggling with meeting signal and power output from the electronic package because there is a need for smaller size and higher number of conductors while maintaining good electrical performance through the system.

A need remains for a high speed socket connector having improved electrical performance.

BRIEF DESCRIPTION OF THE INVENTION

In one embodiment, a socket connector is provided for an electronic system including a socket assembly having a socket substrate and socket contacts terminated to the socket substrate. The socket substrate has an upper surface and a lower surface having a first upper mating area on the upper surface, a second upper mating area on the upper surface and a first lower mating area on the lower surface. The socket substrate has socket substrate conductors on at least one layer of the socket substrate with first socket substrate conductors of the socket substrate conductors are at the first upper mating area, second socket substrate conductors of the socket substrate conductors at the second upper mating area and electrically connected to corresponding first socket substrate conductors, and third socket substrate conductors of the socket substrate conductors at the first lower mating area and being electrically connected to corresponding first socket substrate conductors. The first socket substrate conductors are configured to be electrically connected to an electronic package mated to the first upper mating area. The second socket substrate conductors are configured to be electrically connected to an electrical component mated to the second upper mating area. The third socket substrate conductors are configured to be electrically connected to a host circuit board mated to the first lower mating area. The socket assembly is configured to electrically connect the electronic package with both the host circuit board and the electrical component through corresponding socket substrate conductors. The socket contacts have a base, a terminating end extending from the base and a mating end extending from the base. The terminating end is terminated to corresponding first socket substrate conductors. The mating end has a spring beam deflectable relative to the base and a mating beam at a distal end of the spring beam having a separable mating interface configured to be terminated to corresponding package contacts of the electronic package.

In another embodiment, a socket connector is provided for an electronic system including a socket assembly having a socket substrate and socket contacts terminated to the socket substrate. The socket substrate has an upper surface and a lower surface with a first upper mating area on the upper surface and a first lower mating area on the lower surface. The socket substrate has socket substrate conductors on at least one layer of the socket substrate. First socket substrate conductors of the socket substrate conductors include plated vias extending between the first upper mating area and the second mating area and lower contact pads at the first lower mating area electrically connected to the corresponding plated vias and configured to be electrically connected to a host circuit board by a ball grid array of solder balls. Second socket substrate conductors of the socket substrate conductors include upper contact pads and circuit traces electrically connected to corresponding upper contact pads and routed remote from the first upper mating area for electrical connection to an electrical component remote from the first upper mating area. The socket contacts have a base, a terminating end extending from the base and a mating end extending from the base. The terminating end is terminated to corresponding socket substrate conductors. The mating end has a spring beam deflectable relative to the base and a mating beam at a distal end of the spring beam having a separable mating interface configured to be terminated to corresponding package contacts of the electronic package. The first socket substrate conductors electrically connect the electronic package to the host circuit board and the second socket substrate conductors electrically connect the electronic package to the electrical component.

In another embodiment, an electronic system is provided including a host circuit board having host contacts, an electronic package having a substrate including package contacts and an electronic component on the substrate electrically connected to the package contacts and a socket connector for electrically connecting the electronic package with the host circuit board. The socket connector includes a socket assembly and an electrical component. The socket assembly includes a socket substrate having socket substrate conductors and socket contacts. The socket contacts have a base, a terminating end extending from the base and a mating end extending from the base. The terminating end is terminated to corresponding first socket substrate conductors. The mating end has a spring beam deflectable relative to the base and a mating beam at a distal end of the spring beam having a separable mating interface configured to be terminated to corresponding package contacts of the electronic package. First socket substrate conductors of the socket substrate conductors electrically connect the electronic package to the host circuit board and second socket substrate conductors of the socket substrate conductors electrically connect the electronic package to the electrical component.

In a further embodiment, a socket contact is provided for a socket connector having a base having a front and a rear and a mating end extending from the base. The mating end has a spring beam deflectable relative to the base. The spring beam extends rearward from the base and upward at an angle to elevate the mating end above the base. The mating end has a mating beam extending forward form the spring beam. The mating beam has a separable mating interface configured to be terminated to a package contact of an electronic package. The socket contacts includes a mounting tab extending from the front of the base configured to be soldered to a solder pad of a socket substrate to mechanically secure the mounting tab to the socket substrate. The mating interface is aligned vertically above the mounting tab.

BRIEF DESCRIPTION OF THE DRAWINGS

FIG. 5 is a schematic view of the electronic system in accordance with an exemplary embodiment.

FIG. 6 is a perspective view of a portion of the socket assembly showing a socket contact coupled to a socket substrate in accordance with an exemplary embodiment.

FIG. 7 is a cross-sectional view of a portion of the socket assembly showing a socket contact coupled to a socket substrate in accordance with an exemplary embodiment.

DETAILED DESCRIPTION OF THE INVENTION

Figure 1:
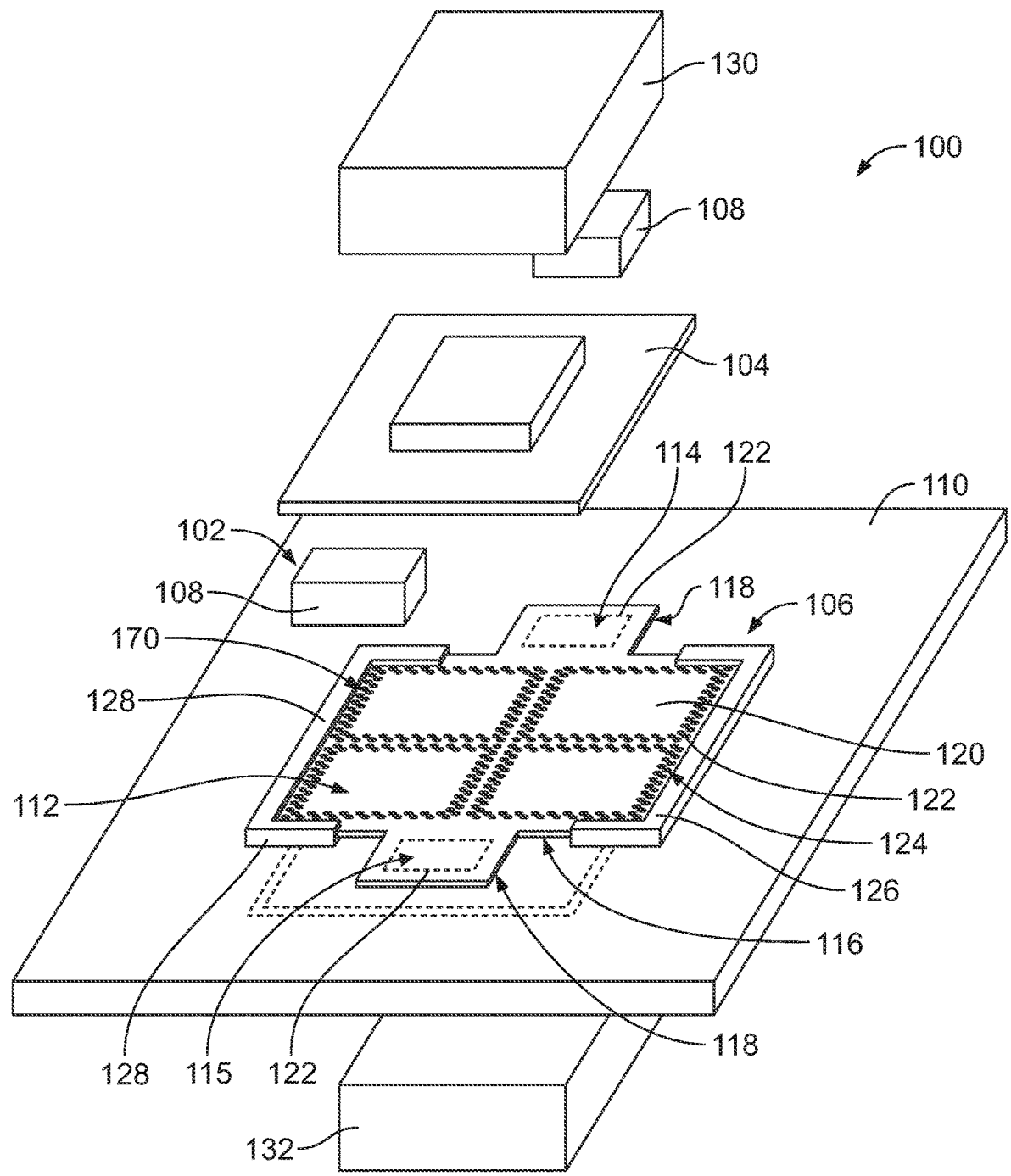
FIG. 1 is an exploded view of an electronic system having a socket assembly formed in accordance with an exemplary embodiment.

FIG. 1 is an exploded view of an electronic system 100 formed in accordance with an exemplary embodiment. The electronic system 100 includes a socket connector 102 that receives an electronic package 104, such as an integrated circuit. The socket connector 102 includes a socket assembly 106 and one or more electrical components 108. The socket assembly 106 is configured to be directly electrically connected to the electronic package 104. The electrical component 108 is configured to be directly electrically connected to the socket assembly 106. The socket assembly 106 electrically connects the electronic package 104 with the electrical component 108. In an exemplary embodiment, the socket assembly 106 is coupled to a host circuit board 110, such as a motherboard. The socket assembly 106 electrically connects the electronic package 104 with the host circuit board 110.

In the illustrated embodiment, the electronic package 104 is coupled to the top of the socket assembly 106 at a first upper mating area 112, multiple electrical components 108 are coupled to the top of the socket assembly 106 at second and third upper mating areas 114, 115, respectively, and the bottom of the socket assembly 106 is coupled to the host circuit board 110 at a lower mating area 116. Other arrangements are possible in alternative embodiments. For example, greater or fewer electrical components 108 may be coupled to the socket assembly 106. Other components may be coupled to the host circuit board 110. The electronic system 100 allows connection of the electrical component(s) 108 to the electronic package 104 directly through the socket assembly 106 as opposed to being electrically connected through the host circuit board 110. For example, high speed data signals may be routed through the socket assembly 106 between the electrical component(s) 108 and the electronic package 104 rather than having the high speed data signals routed through the socket assembly 106 to the host circuit board 110 and then through the host circuit board 110 to the electrical component(s) 108.

The electrical component 108 may be any type of component, such as a data communication device. For example, the electrical component 108 may be an integrated circuit, such as an application-specific integrated circuit (ASIC), a chip, a microprocessor, and the like. In other various embodiments, the electrical component 108 may be an electrical connector, such as a high speed differential pair receptacle connector, a header connector, a card edge connector, and the like. The electrical connector may define an interface for interfacing with another mating connector, such as a cable connector, a paddle card connector, or another type of mating connector. In other various embodiments, the electrical component 108 may be a cable assembly configured to be electrically connected to the socket assembly 106. For example, the cable assembly may include contacts mated to the socket assembly 106 at a separable interface or the cable assembly may include cables soldered to the socket assembly 106. Having the electrical component 108 mounted directly to the socket assembly 106 reduces the number of electrical interfaces along the signal paths between the electronic package 104 and the electrical component 108 to enhance electrical performance of the electronic system 100. For example, high speed data signals may be transferred directly from the electronic package 104 to the electrical component 108 through the socket assembly 106 rather than being first routed through the host circuit board 110.

In an exemplary embodiment, electrical paths from the electronic package 104 to the electrical component 108 pass through the socket assembly 106 and are not routed through the host circuit board 110. For example, in the illustrated embodiment, the electrical paths are high speed electrical paths routed to the electrical component 108 through the socket assembly 106 between the first and second upper mating areas 112, 114. Other electrical paths, such as low speed electrical paths and power electrical paths, are routed between the upper mating area 112 and the lower mating area 116 to electrically connect the electronic package 104 and the host circuit board 110. An interface is provided between the socket assembly 106 and the host circuit board 110, such as a ball grid array (BGA) having solder balls soldered between the host circuit board 110 and corresponding socket substrate conductors on the bottom of the socket assembly 106. However, other types of interfaces may be utilized in alternative embodiments, such as a land grid array (LGA). Optionally, the electrical paths between the socket assembly 106 and the host circuit board 110 may include high speed electrical paths. Optionally, the socket assembly 106 may include a second lower mating area 118, such as aligned with the second upper mating area 114, for interfacing with the host circuit board 110, such as for electrically connecting the electrical component 108 and the host circuit board 110.

In an exemplary embodiment, the socket assembly 106 includes a socket substrate 120 having socket substrate conductors 122 that define electrical paths between the electronic package 104 and the electrical component 108 and between the electronic package 104 and the host circuit board 110. The socket substrate 120 may be a printed circuit board and the socket substrate conductors 122 may be circuits, pads, traces (of or within the socket substrate 120), vias, and the like of the printed circuit board. The socket assembly 106 includes socket contacts 124 coupled to the socket substrate 120. The socket contacts 124 are electrically connected to corresponding socket substrate conductors 122. The socket contacts 124 are configured to be electrically connected to the electronic package 104. The socket contacts 124 may be arranged in an array defining a land grid array (LGA) interface.

The electrical component 108 may be terminated directly to the socket substrate conductors 122, such as by soldering to the socket substrate conductors 122. Alternatively, the socket substrate conductors 122 may be electrically connected to the electrical component 108 using contacts, pins, solder balls, conductive elastomeric columns, or other intervening conductive elements. For example, in an exemplary embodiment, the socket substrate 120 includes an interface on the top side for electrical connection directly to the electrical component 108, such as an LGA interface, a BGA interface, and the like. As such, the socket assembly 106 electrically connects the electrical component 108 to the top of the socket substrate 120. The electrical component 108 may additionally or alternatively be electrically coupled to the bottom of the socket substrate 120.

In an exemplary embodiment, the socket connector 102 includes a socket frame 126 that supports components of the socket connector 102. For example, the socket frame 126 may support the socket assembly 106. The socket frame 126 may support the electronic package 104. The socket frame 126 may support the electrical component 108. The socket frame 126 may be used to align the electronic package 104 with the first upper mating area 112 for mating the electronic package 104 with the socket assembly 106. For example, frame walls 128 of the socket frame 126 may surround a socket opening 170 that receives the electronic package 104 and the frame walls 128 may orient and align the electronic package 104 in one or more directions. In an exemplary embodiment, the socket frame 126 may limit or stop compression of the compressible interface to prevent damage to various components. The socket frame 126 may hold various components together for mounting to other components. The socket frame 126 may receive the socket substrate 120 or alternatively, may be mounted to the top of the socket substrate 120. For example, the electronic package 104 may be pre-assembled to the socket frame 126 and the socket substrate 120 prior to mounting the socket assembly 106 to the host circuit board 110.

In an exemplary embodiment, the electronic system 100 includes a heat sink 130 for dissipating heat from one or more of the components of the electronic system 100, such as from the electronic package 104 and/or the electrical component(s) 108 and/or the socket assembly 106 and/or the host circuit board 110. Optionally, the heat sink 130 may be mounted to the host circuit board 110 and/or a mounting block 132 below the host circuit board 110. For example, the heat sink 130 may be secured to the mounting block 132 using fasteners. Optionally, the components may include one or more compressible interfaces therebetween. For example, the socket contacts 124 may define a separable, compressible interface with the electronic package 104. The socket contacts 124 may be spring biased against the electronic package 104 when the heat sink 130 is coupled to the mounting block 132.

Figure 2:
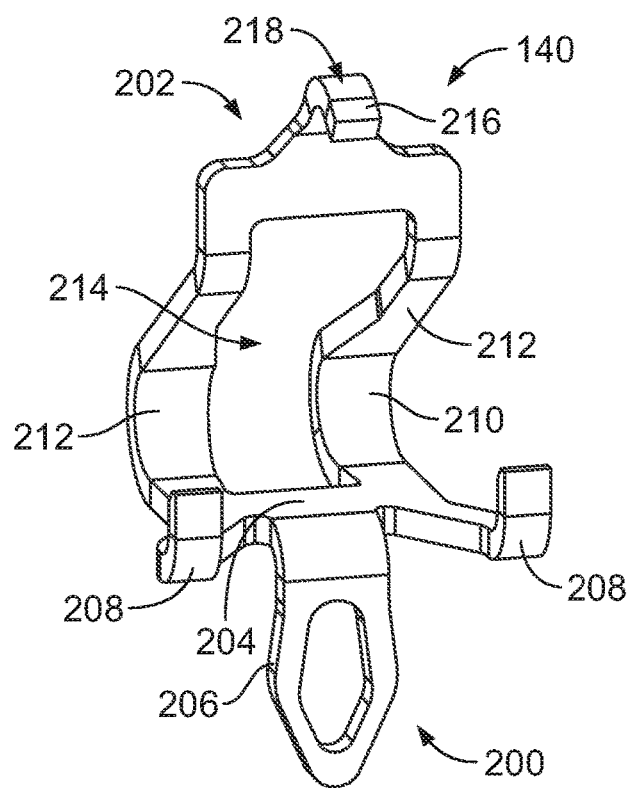
FIG. 2 is a perspective view of a socket contact for the socket assembly in accordance with an exemplary embodiment.

FIG. 2 is a perspective view of a socket contact 140 in accordance with an exemplary embodiment. The socket contact 140 may be used as one or more of the socket contacts 124 (shown in FIG. 1) and is thus an exemplary embodiment of one of the socket contacts 124. As such the socket contacts 124 may include any or all of the features of the socket contact 140 described herein. The socket contact 140 extends between a terminating end 200 and a mating end 202. The socket contact 140 has a base 204 configured to be mounted to the socket substrate 120 (shown in FIG. 1). The mating end 202 extends from the base 204 and is configured to be mated with the electronic package 104 (shown in FIG. 1). The terminating end 200 extends from the base 204 and is configured to be terminated to the socket substrate 120.

In the illustrated embodiment, the terminating end 200 includes a compliant beam 206, such as an eye-of-the-needle contact, configured to be press-fit into a plated via of the socket substrate 120. The compliant beam 206 may be soldered to the socket substrate 120 to mechanically and/or electrically connect the terminating end 200 to the socket substrate 120. Other types of terminating ends 200 may be provided in alternative embodiments. In an exemplary embodiment, the terminating end 200 includes one or more mounting tabs 208 extending from the base 204 at the terminating end 200. For example, in the illustrated embodiment, the terminating end 200 includes two mounting tabs 208 at opposite sides of the socket contacts 140. The mounting tabs 208 are configured to engage the socket substrate 120 to mount the socket contact 140 on the socket substrate 120. The mounting tabs 208 may be soldered to the socket substrate 120 to mechanically and/or electrically connect the terminating end 200 to the socket substrate 120.

The mating end 202 includes a spring beam 210 extending from the base 204. The spring beam 210 is deflectable. In the illustrated embodiment, the spring beam 210 includes two beam arms 212 separated by a gap 214. However, the spring beam 210 may have other shapes in alternative embodiments, including a single beam arm 212. Optionally, the spring beam 210 may be centered on the socket contact 140. In various embodiments, the spring beam 210 may be aligned with the compliant beam 206. In an exemplary embodiment, the socket contact 140 includes a mating beam 216 at the distal end thereof defining a mating interface 218 for mating with the electronic package 104. In an exemplary embodiment, the mating interface 218 is a separable mating interface. The spring beam 210 may be resiliently deflected during loading to spring bias the mating beam 216 against the electronic package 104 to ensure electrical connection between the socket contact 140 and the electronic package 104. Optionally, the mating interface 218 may be approximately aligned over the base 204 and/or the compliant beam 206 such that the compressive forces are centered over and press in the direction of the base 204 and/or the compliant beam 206, such as to reduce tilting or rotating the compliant beam 206 in the plated via. The mating end 202 may have other shapes and features in alternative embodiments. For example, the mating end 202 may include a solder tail or solder tab at the mating end 202 configured to be soldered to the electronic package 104.

Figure 3:
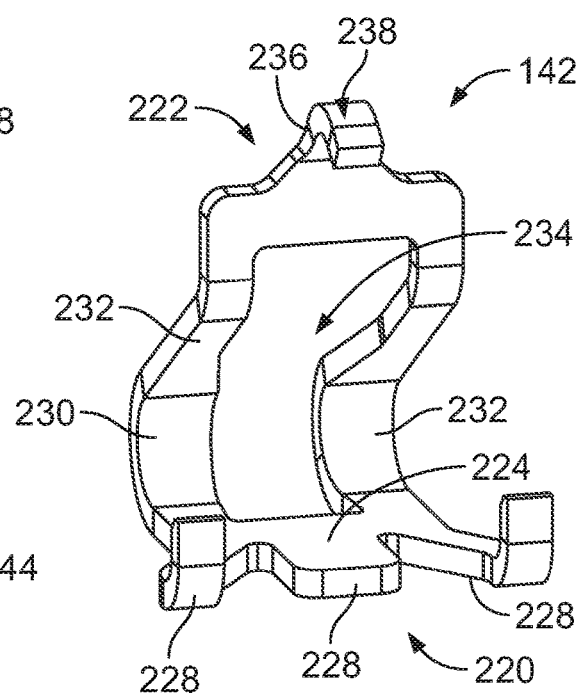
FIG. 3 is a perspective view of a socket contact for the socket assembly in accordance with an exemplary embodiment.

FIG. 3 is a perspective view of a socket contact 142 in accordance with an exemplary embodiment. The socket contact 142 may be used as one or more of the socket contacts 124 (shown in FIG. 1) and is thus an exemplary embodiment of one of the socket contacts 124. As such the socket contacts 124 may include any or all of the features of the socket contact 142 described herein. The socket contact 142 may be similar to the socket contact 140 (shown in FIG. 2). In the illustrated embodiment, the socket contact 142 is a surface mount contact whereas the socket contact 140 is a press-fit socket contact. The socket contact 142 extends between a terminating end 220 and a mating end 222. The socket contact 142 has a base 224. The mating end 222 extends from the base 224 and is configured to be terminated to the electronic package 104 (shown in FIG. 1). The terminating end 220 extends from the base 224 and is configured to be terminated to the socket substrate 120 (shown in FIG. 1).

In an exemplary embodiment, the terminating end 220 includes one or more mounting tabs 228 extending from the base 224 at the terminating end 220. For example, in the illustrated embodiment, the terminating end 220 includes two mounting tabs 228 at opposite sides of the socket contacts 142 and a central mounting tab 228 defining a solder tab configured to be soldered to the socket substrate 120. The mounting tabs 228 are configured to engage the socket substrate 120 to mount the socket contact 142 on the socket substrate 120. Optionally, all of the mounting tabs 228 may be soldered to the socket substrate 120 to mechanically and/or electrically connect the terminating end 220 to the socket substrate 120.

Optionally, the mating end 222 may be identical to the mating end 202 (shown in FIG. 2) of the socket contact 140. The socket contact 142 includes a spring beam 230 extending from the base 224 at the mating end 222. The spring beam 230 is deflectable. In the illustrated embodiment, the spring beam 230 includes two beam arms 232 separated by a gap 234. However, the spring beam 230 may have other shapes in alternative embodiments, including a single beam arm 232. In an exemplary embodiment, the socket contact 142 includes a mating beam 236 at the distal end thereof defining a mating interface 238 for mating with the electronic package 104. In an exemplary embodiment, the mating interface 238 is a separable mating interface. The spring beam 230 may be resiliently deflected during loading to spring bias the mating beam 236 against the electronic package 104 to ensure electrical connection between the socket contact 142 and the electronic package 104. The mating end 222 may have other shapes and features in alternative embodiments. For example, the mating end 222 may include a solder tail or solder tab at the mating end 222 configured to be soldered to the electronic package 104.

Figure 4:
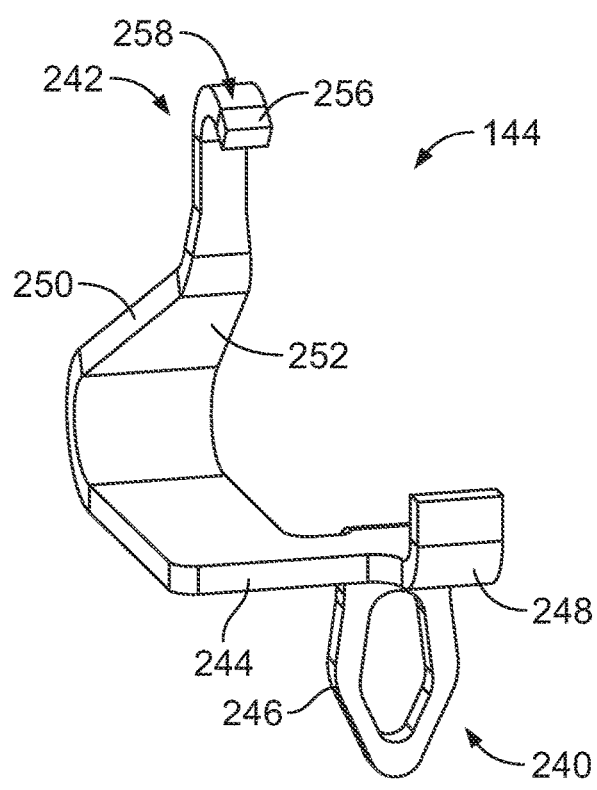
FIG. 4 is a perspective view of a socket contact for the socket assembly in accordance with an exemplary embodiment.

FIG. 4 is a perspective view of a socket contact 144 in accordance with an exemplary embodiment. The socket contact 144 may be used as one or more of the socket contacts 124 (shown in FIG. 1) and is thus an exemplary embodiment of one of the socket contacts 124. As such the socket contacts 124 may include any or all of the features of the socket contact 140 described herein. In the illustrated embodiment, the socket contact 144 is shown as a press-fit socket contact similar to the socket contact 140 (shown in FIG. 2). However, the socket contact 144 may be a surface mount contact similar to the socket contact 142 (shown in FIG. 3) in alternative embodiments. The socket contact 144 extends between a terminating end 240 and a mating end 242. The socket contact 144 has a base 244. The mating end 242 extends from the base 224 and is configured to be terminated to the electronic package 104 (shown in FIG. 1). The terminating end 240 extends from the base 244 and is configured to be terminated to the socket substrate 120 (shown in FIG. 1).

The terminating end 240 includes a compliant beam 246, such as an eye-of-the-needle contact, configured to be press-fit into a plated via of the socket substrate 120. The compliant beam 246 may be soldered to the socket substrate 120 to mechanically and/or electrically connect the terminating end 240 to the socket substrate 120. Other types of terminating ends 240 may be provided in alternative embodiments. In an exemplary embodiment, the terminating end 240 includes one or more mounting tabs 248 extending from the base 244 at the terminating end 240. For example, in the illustrated embodiment, the terminating end 240 includes a single mounting tab at a first side of the socket contacts 144. The mounting tabs 248 are configured to engage the socket substrate 120 to mount the socket contact 144 on the socket substrate 120. Optionally, the mounting tab 248 may be soldered to the socket substrate 120 to mechanically and/or electrically connect the terminating end 240 to the socket substrate 120.

The socket contact 144 includes a spring beam 250 extending from the base 244 at the mating end 242. In the illustrated embodiment, the spring beam 250 is offset relative to the compliant beam 246, such as shifted to a second side of the socket contact 144. The spring beam 250 is deflectable. In the illustrated embodiment, the spring beam 250 includes a single beam arm 252. However, the spring beam 250 may have other shapes in alternative embodiments. In an exemplary embodiment, the socket contact 144 includes a mating beam 256 at the distal end thereof defining a mating interface 258 for mating with the electronic package 104. In an exemplary embodiment, the mating interface 258 is a separable mating interface. The spring beam 250 may be resiliently deflected during loading to spring bias the mating beam 256 against the electronic package 104 to ensure electrical connection between the socket contact 144 and the electronic package 104. The mating end 242 may have other shapes and features in alternative embodiments. For example, the mating end 242 may include a solder tail or solder tab at the mating end 242 configured to be soldered to the electronic package 104.

FIG. 5 is a schematic view of the electronic system 100 in accordance with an exemplary embodiment. FIG. 5 illustrates the socket connector 102 mounted to the host circuit board 110 and the electronic package 104 coupled to the socket connector 102. For example, the electronic package 104 is received in the socket frame 126 and mated to the socket contacts 124 on the socket substrate 120. The electronic package 104 is electrically connected to the host circuit board 110 by the socket contacts 124 and the corresponding socket substrate conductors 122. The electrical component 108 is coupled to the socket substrate 120 and electrically connected to the electronic package 104 by corresponding socket substrate conductors 122. In the illustrated embodiment, the socket contacts 124 include both the first socket contacts 140 and the second socket contacts 142 or other types of socket contacts such as the socket contacts 144. However, in alternative embodiments, the socket contacts 124 may be entirely first socket contacts 140 or entirely second socket contacts 142 or other types of socket contacts such as the socket contacts 144. In an exemplary embodiment, the first socket contacts 140 are electrically connected to socket substrate conductors 122 that are electrically connected to the host circuit board 110, whereas the second socket contacts 142 are electrically connected to socket substrate conductors 122 that are electrically connected to the electrical component 108.

In an exemplary embodiment, the electronic package 104 is an integrated circuit component, such as an application-specific integrated circuit (ASIC). However, other types of electronic packages may be used in alternative embodiments, such as photonic integrated circuits, chips, processors, memory devices and the like. The electronic package 104 includes a substrate 150 having an upper surface 152 and a lower surface 154. The electronic package 104 includes package contacts 156 defined by circuits of the substrate 150. In an exemplary embodiment, the package contacts 156 are provided on the lower surface 154. However the electronic package 104 may additionally or alternatively include the package contacts 156 on the upper surface 152. The package contacts 156 may include pads, traces, vias, beams, wires or other types of contacts. In the illustrated embodiment, the electronic package 104 includes an electronic component 158, such as a chip, on the upper surface 152. The electronic component 158 may be electrically connected to the package contacts 156 through traces or circuits of the substrate 150. In an alternative embodiment, rather than having a separate substrate 150 and electronic component 158, the electronic package 104 may include the electronic component 158 without the substrate 150 having the package contacts 156 on the electronic component 158.

During assembly, the socket connector 102 is positioned above the host circuit board 110 and mechanically and electrically connected to an upper surface 160 of the host circuit board 110. For example, a BGA of solder balls 162 is used to electrically connect the socket connector 102 to the host circuit board 110. During assembly, the electrical component 108 is positioned above the socket substrate 120 and mechanically and electrically connected to the socket substrate 120 at the second upper mating area 114. For example, the electrical component 108 may be soldered to the socket substrate 120, such as using solder balls 164. During assembly, the electronic package 104 is positioned above the socket assembly 106 and mechanically and electrically connected to the socket assembly 106. For example, the electronic package 104 may be aligned with the socket opening 170 in the socket frame 126 and coupled to the socket contacts 124. The socket frame 126 may align and position the electronic package 104 relative to the socket assembly 106. The electronic package 104 is forced downward onto the socket contacts 124 to compress the socket contacts 124. For example, the heat sink (shown in FIG. 1) may press downward on the electronic package 104. In other various embodiments, the socket frame 126 may be used to press downward on the electronic package 104, such as with a clip or cover. In an exemplary embodiment, the socket frame 126 may limit compression or downward movement of the electronic package 104, such as to prevent damage or overstress of the socket contacts 124.

The socket substrate 120 may be a printed circuit board and the socket substrate conductors 122 may be circuits of the printed circuit board. For example, the socket substrate conductors 122 may include pads, traces (of or within the socket substrate 120), vias, and the like extending through and/or along one or more layers of and/or within the socket substrate 120, according to various embodiments. The socket substrate 120 includes an upper surface 260 and a lower surface 262. In an exemplary embodiment, portions of various socket substrate conductors 122 may be exposed on the upper surface 260 and portions of various socket substrate conductors 122 may be exposed on the lower surface 262.

In an exemplary embodiment, the socket substrate conductors 122 include upper contact pads 270 on the upper surface 260 at the first upper mating area 112 within the socket opening 170 for electrical connection with corresponding socket contacts 124. The upper surface 260 may have a solder mask or other layers at the upper surface 260. Optionally, the upper contact pads 270 may be exposed at the upper surface 260 for electrical connection with the socket contacts 124. In an exemplary embodiment, the socket substrate conductors 122 include plated vias 272 extending at least partially through the socket substrate 120. Optionally, at least some of the plated vias 272 extend entirely between the upper surface 260 and the lower surface 262. The plated vias 272 may receive corresponding compliant beams 206 (shown in FIG. 2) for electrical connection with corresponding socket contacts 140. The plated vias 272 may be associated with corresponding contact pads 270. Alternatively, the plated vias 272 may be provided without the contact pads 270. In an exemplary embodiment, the socket substrate conductors 122 include lower contact pads 274 on the lower surface 262 at the first lower mating area 116 for electrical connection with corresponding solder balls 162. The lower contact pads 274 are electrically connected to corresponding plated vias 272.

In an exemplary embodiment, the socket substrate conductors 122 include upper contact pads 280 on the upper surface 260 at the second upper mating area 114 for electrical connection with the electrical component 108, such as through the solder balls 164. The second upper mating area 114 is outside of socket opening 170 and remote from first upper mating area 112. In an exemplary embodiment, the socket substrate conductors 122 include plated vias 282 extending at least partially through the socket substrate 120 between the upper surface 260 and the lower surface 262 at the second upper mating area 114 and the second lower mating area 118. The plated vias 282 are electrically connected to the electrical component 108 through corresponding upper contact pads 280. In an exemplary embodiment, the socket substrate conductors 122 include lower contact pads 284 on the lower surface 262 at the second lower mating area 118 for electrical connection with corresponding solder balls 162. The lower contact pads 284 are electrically connected to corresponding plated vias 282.

In an exemplary embodiment, the socket substrate conductors 122 include traces 290 on one or more layers of and/or within the socket substrate 120 according to various embodiments. In order to maximize electrical performance properties for high speed signal transmission, traces 290 may be provided within the socket substrate 120 at a certain depth or varying depths, according to various specific embodiments. The traces 290 extend between the first upper mating area 112 and the second upper mating area 114. The traces 290 are electrically connected to corresponding upper contact pads 270 and upper contact pads 280. The traces 290 electrically connect the electronic package 104 and the electrical component 108.

In an exemplary embodiment, first electrical paths 292 are defined between the electronic package 104 and the host circuit board 110 by the socket contacts 140, the upper contact pads 270, the plated vias 272, the lower contact pads 274 and the solder balls 162. In an exemplary embodiment, the first electrical paths 292 are used for power and low speed data signal paths. However, the first electrical paths 292 may additionally or alternatively be used for high speed data signals. In an exemplary embodiment, second electrical paths 294 are defined between the electronic package 104 and the electrical component 108 by the socket contacts 142, the upper contact pads 270, the traces 290, the upper contact pads 280 and the solder balls 164. The second electrical paths 294 may be used for high speed data signals. However, the second electrical paths 294 may additionally or alternatively be used for other purposes such as low speed data signals, power paths, and the like. In an exemplary embodiment, third electrical paths 296 are defined between the electrical component 108 and the host circuit board 110 by the solder balls 164, the upper contact pads 280, the plated vias 282, the lower contact pads 284 and the solder balls 162. The third electrical paths 296 may be used for power and low speed data signal paths however, the third electrical paths 296 may additionally or alternatively be used for high speed data signals.

In an exemplary embodiment, the electrical component 108 is an integrated circuit 310, such as an application-specific integrated circuit (ASIC). However, other types of electrical component may be used in alternative embodiments, such as photonic integrated circuits, chips, processors, memory devices and the like. The electrical component 108 includes a substrate 300 having an upper surface 302 and a lower surface 304. The electrical component 108 includes package contacts 306. In an exemplary embodiment, the package contacts 306 are provided on the lower surface 304. However the electronic package 104 may additionally or alternatively include the package contacts 306 on the upper surface 302. The package contacts 306 may include pads, traces, vias, beams, wires or other types of contacts. The package contacts 306 are electrically connected to the socket substrate 120 at corresponding socket substrate conductors 122. For example, in the illustrated embodiment, the package contacts 306 are soldered to the upper contact pads 280. However, the package contacts 306 may be terminated by other means in alternative embodiments, such as using a LGA, a BGA, press-fit beams, and the like.

Figure 8:
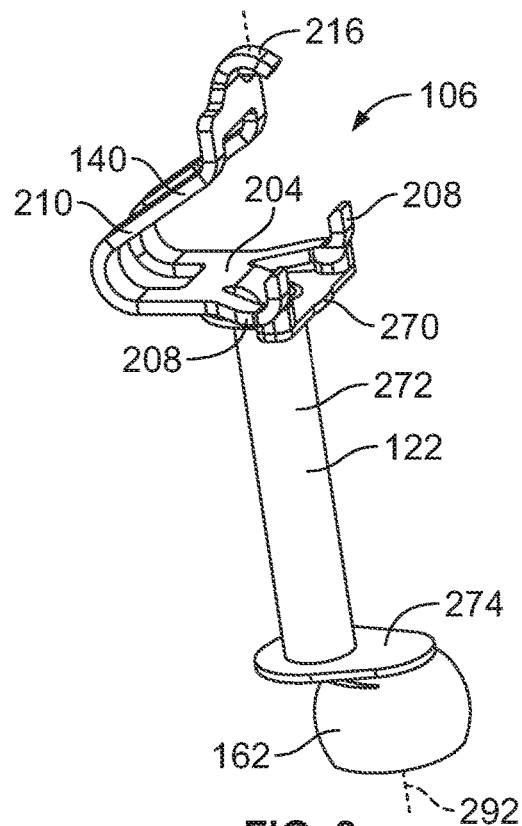
FIG. 8 is a perspective view of a portion of the socket assembly showing a socket contact coupled to a corresponding socket substrate conductor in accordance with an exemplary embodiment.

FIG. 6 is a perspective view of a portion of the socket assembly 106 showing the socket contact 140 coupled to the socket substrate 120. FIG. 7 is a cross-sectional view of a portion of the socket assembly 106 showing the socket contact 140 coupled to the socket substrate 120. FIG. 8 is a perspective view of a portion of the socket assembly 106 showing the socket contact 140 coupled to the corresponding socket substrate conductor 122. The socket substrate conductor 122 includes the upper contact pad 270, the plated via 272 and the lower contact pad 274. The solder ball 162 is soldered to the lower contact pad 274.

The base 204 of the socket contact 140 is mounted to the upper surface 260 of the socket substrate 120. Optionally, a solder mask 312 or another layer may be provided at the upper surface 260. The mounting tabs 208 extend from the base 204 and are mounted to the socket substrate 120. In an exemplary embodiment, the mounting tabs 208 are soldered to the upper contact pad 270 to mechanically couple the socket contact 140 to the socket substrate 120 and electrically connect the socket contact 140 to the socket substrate conductor 122. The compliant beam 206 extends from the base 204 into the plated via 272. In an exemplary embodiment, the compliant beam 206 is press-fit in the plated via 272 to mechanically couple the socket contact 140 to the socket substrate 120 and electrically connect the socket contact 140 to the socket substrate conductor 122.

The spring beam 210 extends from the base 204 to position the mating beam 216 above the socket substrate 120 for electrically connecting to the electronic package 104 (shown in FIG. 5). The spring beam 210 is deflectable to compress the mating beam 216 toward the socket substrate 120. The socket contact 140 and the socket substrate conductor 122 form parts of the electrical path 292 between the electronic package 104 and the host circuit board 110

(shown in FIG. 5). For example, the electrical path 292 extends from the mating beam 216, through the spring beam 210, through the base 204, through the compliant beam 206 and/or the mounting tab 208, through the upper contact pad 270 and/or the plated via 272, through the lower contact pad 274 and through the solder ball 162. Any part of the electrical path 292 may be considered a socket substrate conductor 122 or the entire electrical path 292 may be considered a socket substrate conductor 122. For example, the upper contact pad 270 may be considered a socket substrate conductor 122 and/or the plated via 272 may be considered a socket substrate conductor 122 and/or the lower contact pad 274 may be considered a socket substrate conductor 122. As such, the socket contact 140 may be electrically connected to the host circuit board 110 by one or more socket substrate conductors 122.

Figure 9:
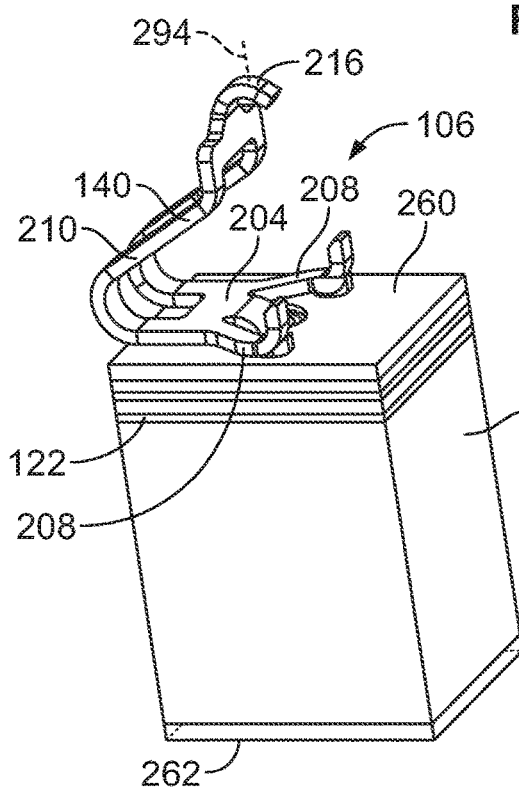
FIG. 9 is a perspective view of a portion of the socket assembly showing a socket contact coupled to a socket substrate in accordance with an exemplary embodiment.
Figure 10:
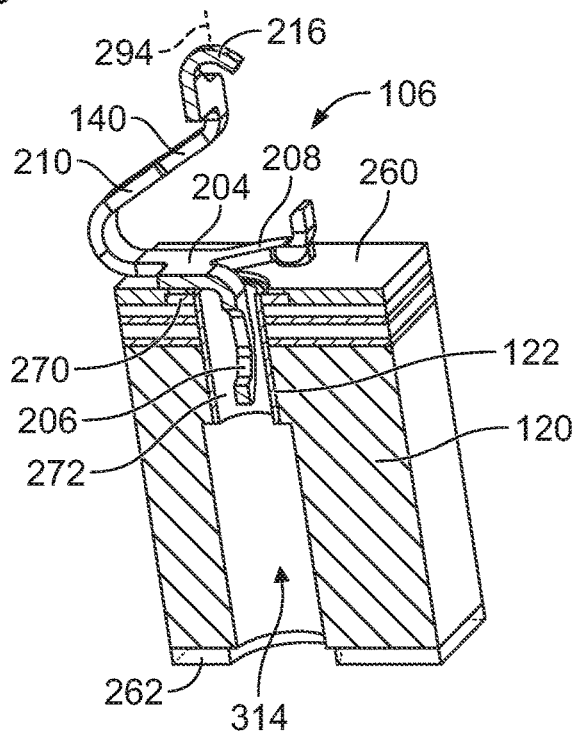
FIG. 10 is a cross-sectional view of a portion of the socket assembly showing a socket contact coupled to a socket substrate in accordance with an exemplary embodiment.
Figure 11:
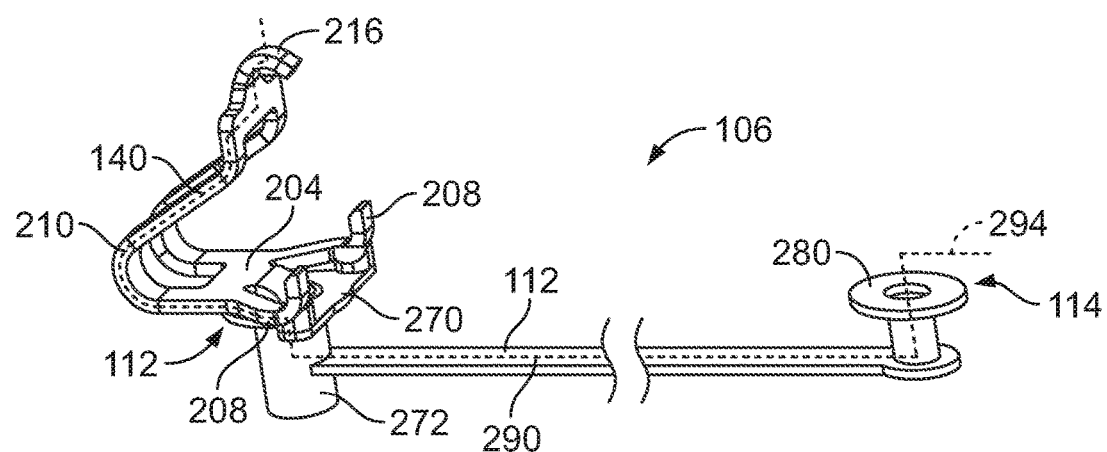
FIG. 11 is a perspective view of a portion of the socket assembly showing a socket contact coupled to a corresponding socket substrate conductor in accordance with an exemplary embodiment.

FIG. 9 is a perspective view of a portion of the socket assembly 106 showing the socket contact 140 coupled to the socket substrate 120. FIG. 10 is a cross-sectional view of a portion of the socket assembly 106 showing the socket contact 140 coupled to the socket substrate 120. FIG. 11 is a perspective view of a portion of the socket assembly 106 showing the socket contact 140 coupled to the corresponding socket substrate conductor 122. The socket substrate conductor 122 includes the upper contact pad 270, the plated via 272, the circuit trace 290 and the upper contact pad 280.

The base 204 of the socket contact 140 is mounted to the upper surface 260 of the socket substrate 120. The mounting tabs 208 extend from the base 204 and are mounted to the socket substrate 120. In an exemplary embodiment, the mounting tabs 208 are soldered to the upper contact pad 270 to mechanically couple the socket contact 140 to the socket substrate 120 and electrically connect the socket contact 140 to the socket substrate conductor 122. The compliant beam 206 extends from the base 204 into the plated via 272. In an exemplary embodiment, the compliant beam 206 is press-fit in the plated via 272 to mechanically couple the socket contact 140 to the socket substrate 120 and electrically connect the socket contact 140 to the socket substrate conductor 122.

In an exemplary embodiment, the plated via 272 is back drilled from the lower surface 262, such as to an area at or near the connection point with the compliant beam 206, thus forming a back drilled bore 314. Because the electrical path 294 is routed from the 1$^{st}$ upper mating area 112 to the 2$^{nd}$ upper mating area 114 there is no need for the plated via 272 to extend to the lower surface 262 of the socket substrate 120. Back drilling the plated via 272 removes a length of the plated via 272, such as the bottom portion of the plated via 272. Back drilling the plated via 272 reduces electrical stub along the signal path enhancing electrical performance of the socket assembly 106.

The spring beam 210 extends from the base 204 to position the mating beam 216 above the socket substrate 120 for electrically connecting to the electronic package 104 (shown in FIG. 5). The spring beam 210 is deflectable to compress the mating beam 216 toward the socket substrate 120. The socket contact 140 and the socket substrate conductor 122 form parts of the electrical path 294 between the electronic package 104 and the electrical component 108 (shown in FIG. 5). For example, the electrical path 294 extends from the mating beam 216, through the spring beam 210, through the base 204, through the compliant beam 206 and/or the mounting tab 208, through the upper contact pad 270 and/or the plated via 272, through the circuit trace 290 and through the upper contact pad 280. Any part of the electrical path 294 may be considered a socket substrate conductor 122 or the entire electrical path 294 may be considered a socket substrate conductor 122. For example, the upper contact pad 270 may be considered a socket substrate conductor 122 and/or the plated via 272 may be considered a socket substrate conductor 122 and/or the circuit trace 290 may be considered a socket substrate conductor 122 and/or the upper contact pad 280 may be considered a socket substrate conductor 122. As such, the socket contact 140 may be electrically connected to the electrical component 108 by one or more socket substrate conductors 122.

Figures 12, 13:
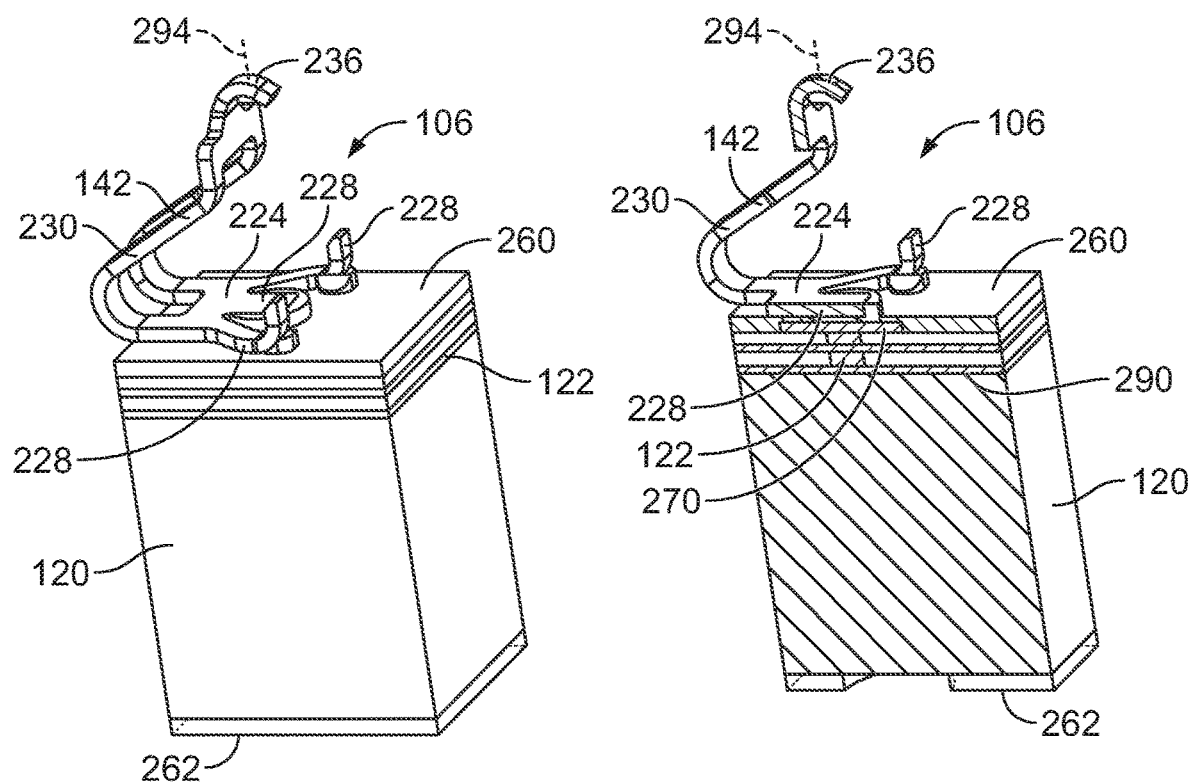
FIG. 12 is a perspective view of a portion of the socket assembly showing a socket contact coupled to a socket substrate in accordance with an exemplary embodiment.
FIG. 13 is a cross-sectional view of a portion of the socket assembly showing a socket contact coupled to a socket substrate in accordance with an exemplary embodiment.
Figure 14:
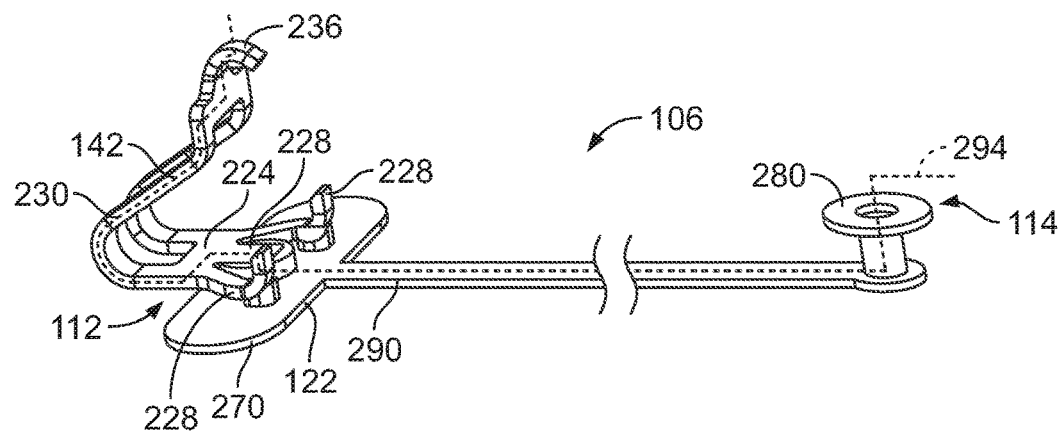
FIG. 14 is a perspective view of a portion of the socket assembly showing a socket contact coupled to a corresponding socket substrate conductor in accordance with an exemplary embodiment.

FIG. 12 is a perspective view of a portion of the socket assembly 106 showing the socket contact 142 coupled to the socket substrate 120. FIG. 13 is a cross-sectional view of a portion of the socket assembly 106 showing the socket contact 142 coupled to the socket substrate 120. FIG. 14 is a perspective view of a portion of the socket assembly 106 showing the socket contact 142 coupled to the corresponding socket substrate conductor 122. The socket substrate conductor 122 includes the upper contact pad 270, the circuit trace 290 and the upper contact pad 280. Because the socket contact 142 does not include a compliant beam, there is no need for any plated via. Because the electrical path 294 is routed from the 1$^{st}$ upper mating area 112 to the 2$^{nd}$ upper mating area 114 there is no need for the plated via to extend to the lower surface 262 of the socket substrate 120 thus eliminating electrical stub along the signal path enhancing electrical performance of the socket assembly 106.

The base 224 of the socket contact 142 is mounted to the upper surface 260 of the socket substrate 120. The mounting tabs 228 extend from the base 224 and are mounted to the socket substrate 120. In an exemplary embodiment, the mounting tabs 228 are soldered to the upper contact pad 270 to mechanically couple the socket contact 142 to the socket substrate 120 and electrically connect the socket contact 142 to the socket substrate conductor 122.

The spring beam 230 extends from the base 224 to position the mating beam 236 above the socket substrate 120 for electrically connecting to the electronic package 104 (shown in FIG. 5). The spring beam 230 is deflectable to compress the mating beam 236 toward the socket substrate 120. The socket contact 142 and the socket substrate conductor 122 form parts of the electrical path 294 between the electronic package 104 and the electrical component 108 (shown in FIG. 5). For example, the electrical path 294 extends from the mating beam 236, through the spring beam 230, through the base 224, through the compliant beam 226 and/or the mounting tab 228, through the upper contact pad 270, through the circuit trace 290 and through the upper contact pad 280. Any part of the electrical path 294 may be considered a socket substrate conductor 122 or the entire electrical path 294 may be considered a socket substrate conductor 122. For example, the upper contact pad 270 may be considered a socket substrate conductor 122 and/or the circuit trace 290 may be considered a socket substrate conductor 122 and/or the upper contact pad 280 may be considered a socket substrate conductor 122. As such, the socket contact 142 may be electrically connected to the electrical component 108 by one or more socket substrate conductors 122.

Figure 15:
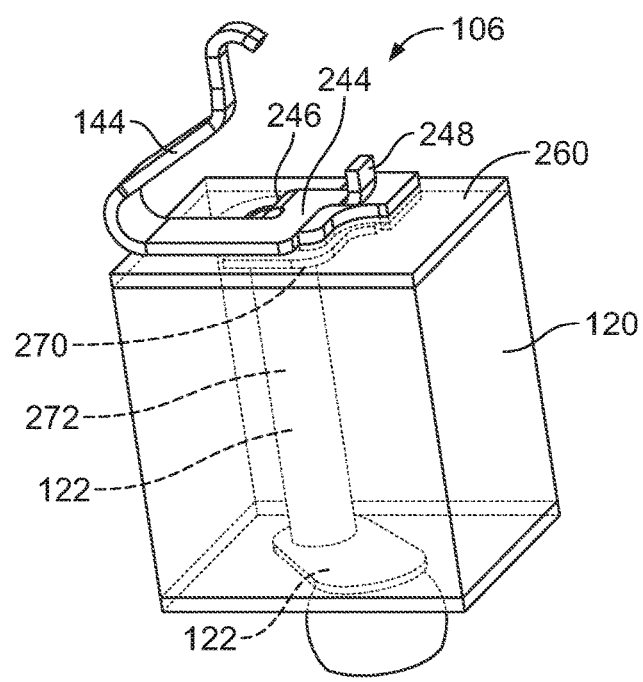
FIG. 15 is a perspective view of a portion of the socket assembly showing a socket contact coupled to a socket substrate in accordance with an exemplary embodiment.

FIG. 15 is a perspective view of a portion of the socket assembly 106 showing the socket contact 144 coupled to the socket substrate 120. The base 244 of the socket contact 144 is mounted to the upper surface 260 of the socket substrate 120. The mounting tabs 248 extend from the base 244 and are mounted to the socket substrate 120. In an exemplary embodiment, the mounting tabs 248 are soldered to the upper contact pad 270 to mechanically couple the socket contact 144 to the socket substrate 120 and electrically connect the socket contact 144 to the socket substrate conductor 122. The compliant beam 246 extends from the base 244 into the plated via 272 to mechanically couple the socket contact 144 to the socket substrate 120 and electrically connect the socket contact 144 to the socket substrate conductor 122.

Figure 16:
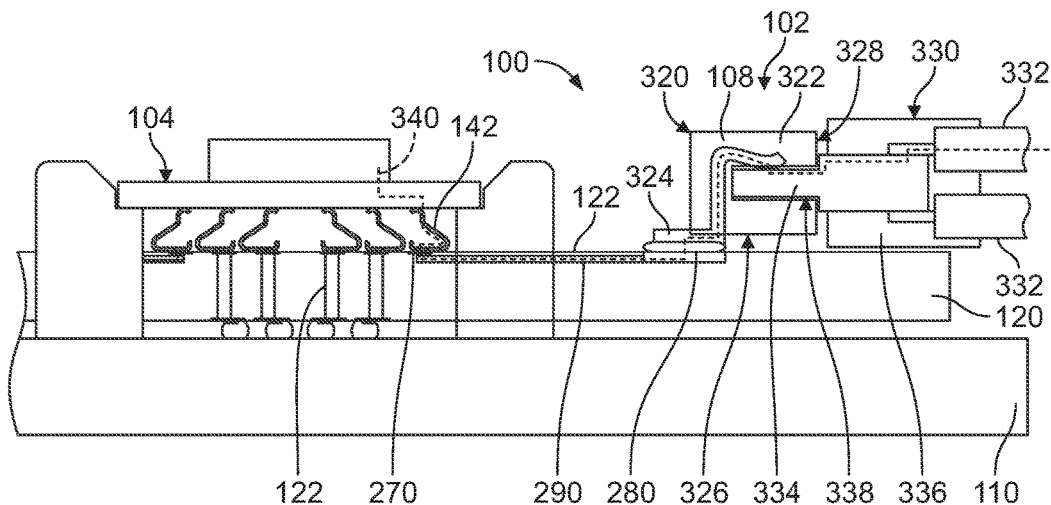
FIG. 16 is a schematic view of the electronic system in accordance with an exemplary embodiment.

FIG. 16 is a schematic view of the electronic system 100 in accordance with an exemplary embodiment. FIG. 16 illustrates the socket connector 102 mounted to the host circuit board 110 and the electronic package 104 coupled to the socket connector 102 similar to the embodiment illustrated in FIG. 5. FIG. 16 illustrates the electrical component 108 as an electrical connector 320, such as a card edge connector. The electrical connector 320 is coupled to the socket substrate 120 and electrically connected to the electronic package 104 by corresponding socket substrate conductors 122.

The electrical connector 320 includes a housing 322 having a mating end 324 and a mounting end 326. The housing 322 holds contacts 328 terminated to the socket substrate 120. In the illustrated embodiment, the housing 322 is a right angle housing having the mating end 324 perpendicular to the mounting end 326. For example, the mating end 324 may be at a front of the housing 322 and the mounting end 326 may be at a bottom of the housing 322. However, other types of housings 322 may be provided in alternative embodiments, such as a vertical housing having the mating end 324 at the top of the housing 322. The contacts 328 may be held in the housing 322. Alternatively, the contacts 328 may be part of stacked contact modules received in the housing 324.

The electrical connector 320 is configured to be mated with a mating electrical connector 330. In the illustrated embodiment, the electrical connector 320 is a receptacle connector and the mating electrical connector 330 is a plug connector. The mating electrical connector 330 may be a cable connector having a plurality of cables 332. In the illustrated embodiment, the cables 332 are terminated to a paddle card 334 held in a housing 336 of the mating electrical connector 330. The paddle card 334 is received in a card slot 338 in the housing 322 of the electrical connector 320 and electrically connected to the contacts 328. Other types of electrical connectors 320 and mating electrical connectors 330 may be used in alternative embodiments.

In an exemplary embodiment, electrical paths 340 are defined between the electronic package 104 and the electrical component 108 by the socket contacts 142, the upper contact pads 270, the traces 290, the upper contact pads 280 and the contacts 328. The electrical paths 340 may be used for high speed data signals however, the electrical paths 340 may additionally or alternatively be used for other purposes such as low speed data signals, power paths, and the like.

Figure 17:
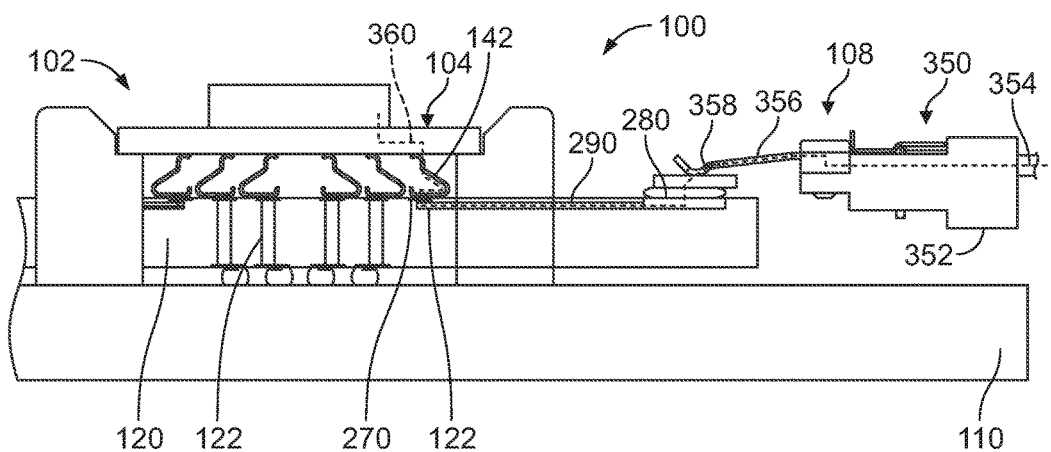
FIG. 17 is a schematic view of the electronic system in accordance with an exemplary embodiment.

FIG. 17 is a schematic view of the electronic system 100 in accordance with an exemplary embodiment. FIG. 17 illustrates the socket connector 102 mounted to the host circuit board 110 and the electronic package 104 coupled to the socket connector 102 similar to the embodiment illustrated in FIG. 5. FIG. 17 illustrates the electrical component 108 as a cable assembly 350, which is attachable to the socket substrate 120 and/or host circuit board 110 through, for example, an insulating housing and latch assembly (not shown). The cable assembly 350 is coupled to the socket substrate 120 and electrically connected to the electronic package 104 by corresponding socket substrate conductors 122.

The cable assembly 350 includes a housing 352 holding a plurality of cables 354. The housing 352 holds contacts 356 terminated to corresponding cables 354. The contacts 356 have mating ends 358 terminated to the socket substrate 120. For example, the mating ends 358 of the contacts 356 are spring biased against the upper contact pads 280. Other types of cable assemblies may be used in alternative embodiments.

In an exemplary embodiment, electrical paths 360 are defined between the electronic package 104 and the electrical component 108 by the socket contacts 142, the upper contact pads 270, the traces 290 (of or within the socket substrate 120), the upper contact pads 280 and the contacts 356. The electrical paths 360 may be used for high speed data signals however, the electrical paths 360 may additionally or alternatively be used for other purposes such as low speed data signals, power paths, and the like.

Figure 18:
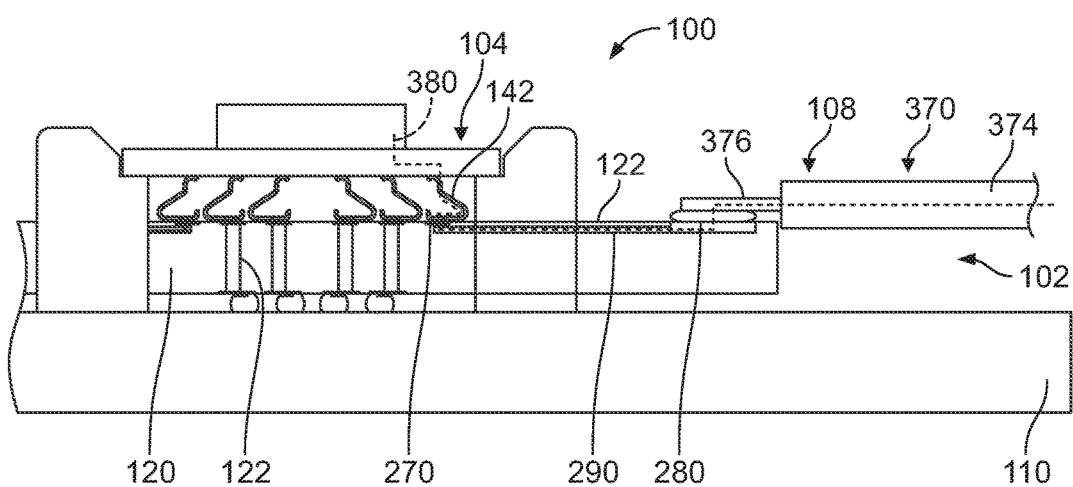
FIG. 18 is a schematic view of the electronic system in accordance with an exemplary embodiment.

FIG. 18 is a schematic view of the electronic system 100 in accordance with an exemplary embodiment. FIG. 18 illustrates the socket connector 102 mounted to the host circuit board 110 and the electronic package 104 coupled to the socket connector 102 similar to the embodiment illustrated in FIG. 5. FIG. 18 illustrates the electrical component 108 as a cable assembly 370, which is attachable to the socket substrate 120 and/or host circuit board 110 through, for example, an insulating housing and latch assembly (not shown). The cable assembly 370 is coupled to the socket substrate 120 and electrically connected to the electronic package 104 by corresponding socket substrate conductors 122.

The cable assembly 370 includes cables 374 having cable conductors 376 terminated to the socket substrate 120. For example, the cable conductors 376 may be soldered directly to corresponding upper contact pads 280. Other types of cable assemblies may be used in alternative embodiments.

In an exemplary embodiment, electrical paths 380 are defined between the electronic package 104 and the electrical component 108 by the socket contacts 142, the upper contact pads 270, the traces 290, the upper contact pads 280 and the cable conductors 376. The electrical paths 380 may be used for high speed data signals however, the electrical paths 380 may additionally or alternatively be used for other purposes such as low speed data signals, power paths, and the like.

Figures 19, 20:
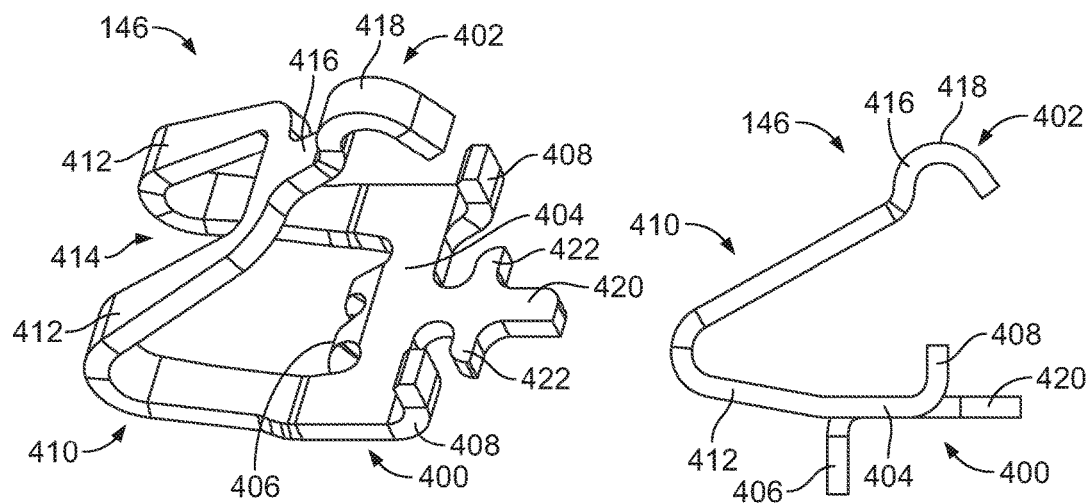
FIG. 19 is a perspective view of a socket contact in accordance with an exemplary embodiment.
FIG. 20 is a side view of a socket contact in accordance with an exemplary embodiment.

FIG. 19 is a perspective view of a socket contact 146 in accordance with an exemplary embodiment. FIG. 20 is a side view of the socket contacts 146 in accordance with an exemplary embodiment. The socket contact 146 may be used as one or more of the socket contacts 124 (shown in FIG. 1) and is thus an exemplary embodiment of one of the socket contacts 124. As such, the socket contacts 124 may include any or all of the features of the socket contact 146 described herein. The socket contact 146 extends between a terminating end 400 and a mating end 402. The socket contact 146 has a base 404 configured to be mounted to the socket substrate 120 (shown in FIG. 1). The mating end 402 extends from the base 404 and is configured to be mated with the electronic package 104 (shown in FIG. 1). The terminating end 400 extends from the base 404 and is configured to be terminated to the socket substrate 120.

In the illustrated embodiment, the terminating end 400 includes a compliant beam 406, such as an eye-of-the-needle contact, configured to be press-fit into a plated via of the socket substrate 120. The compliant beam 406 may be soldered to the socket substrate 120 to mechanically and/or electrically connect the terminating end 400 to the socket substrate 120. Other types of terminating ends 400 may be provided in alternative embodiments.

In an exemplary embodiment, the terminating end 400 includes one or more side mounting tabs 408 extending from the base 404 at the terminating end 400. For example, in the illustrated embodiment, the terminating end 400 includes two mounting tabs 408 at opposite sides of the socket contacts 146. The mounting tabs 408 are configured to engage the socket substrate 120 to mount the socket contact 146 on the socket substrate 120. The mounting tabs 408 may be soldered to the socket substrate 120 to mechanically and/or electrically connect the terminating end 400 to the socket substrate 120. The mounting tabs 408 may provide structural support for the socket contacts 146 on the socket substrate 120, such as to prevent tipping or rolling on the upper surface of the socket substrate 120.

The terminating end 400 includes a forward mounting tab 420 extending from the base 404. In the illustrated embodiment, the mounting tab 420 is configured to engage the socket substrate 120 to mount the socket contact 146 on the socket substrate 120. The mounting tab 420 may be soldered to the socket substrate 120 to mechanically and/or electrically connect the terminating end 400 to the socket substrate 120. The mounting tab 420 may provide structural support for the socket contacts 146 on the socket substrate 120, such as to prevent tipping or rolling on the upper surface of the socket substrate 120. For example, in the illustrated embodiment, the mounting tab 420 includes stabilizing arms 422 to prevent horizontal rolling. In the illustrated embodiment, the mounting tab 420 is cross-shaped to provide a large surface area for soldering and to structurally tie the mounting tab 420 into the solder.

The mating end 402 includes a spring beam 410 extending from the base 404. The spring beam 410 is deflectable. In the illustrated embodiment, the spring beam 410 includes two beam arms 412 separated by a gap 414. However, the spring beam 410 may have other shapes in alternative embodiments, including a single beam arm 412. Optionally, the spring beam 410 may be centered on the socket contact 146. In various embodiments, the spring beam 410 may be aligned with the compliant beam 406. In an exemplary embodiment, the spring beam 410 is angled upwardly away from the base 404 to elevate the spring beam 410 off of the upper surface of the socket substrate 120. As such, the spring beam 410 is able to be moved further away from other socket contacts 146 within the array, such as away from the solder of the adjacent socket contacts 146 to prevent short-circuiting and/or allow tighter spacing of the socket contacts 146.

In an exemplary embodiment, the socket contact 146 includes a mating beam 416 at the distal end thereof defining a mating interface 418 for mating with the electronic package 104. In an exemplary embodiment, the mating interface 418 is aligned directly over the mounting tab 420 for stability during loading or compression of the spring beam 410 and the mating beam 416. For example, bending moments may be eliminated by aligning the mating interface 418 over the mounting tab 420, such as to reducing tipping of the socket contact 146, such as to reduce stress in the solder joint. In an exemplary embodiment, the mating interface 418 is a separable mating interface. The spring beam 410 may be resiliently deflected during loading to spring bias the mating beam 416 against the electronic package 104 to ensure electrical connection between the socket contact 146 and the electronic package 104. Optionally, the mating interface 418 may be approximately aligned over the base 404 and/or the mounting tab 420 such that the compressive forces are centered over and press in the direction of the base 404 and/or the mounting tab 420, such as to reduce tilting or rotating the compliant beam 406 in the plated via or on the upper surface of the socket substrate 120. The mating end 402 may have other shapes and features in alternative embodiments. For example, the mating end 402 may include a solder tail or solder tab at the mating end 402 configured to be soldered to the electronic package 104.

Figure 21:
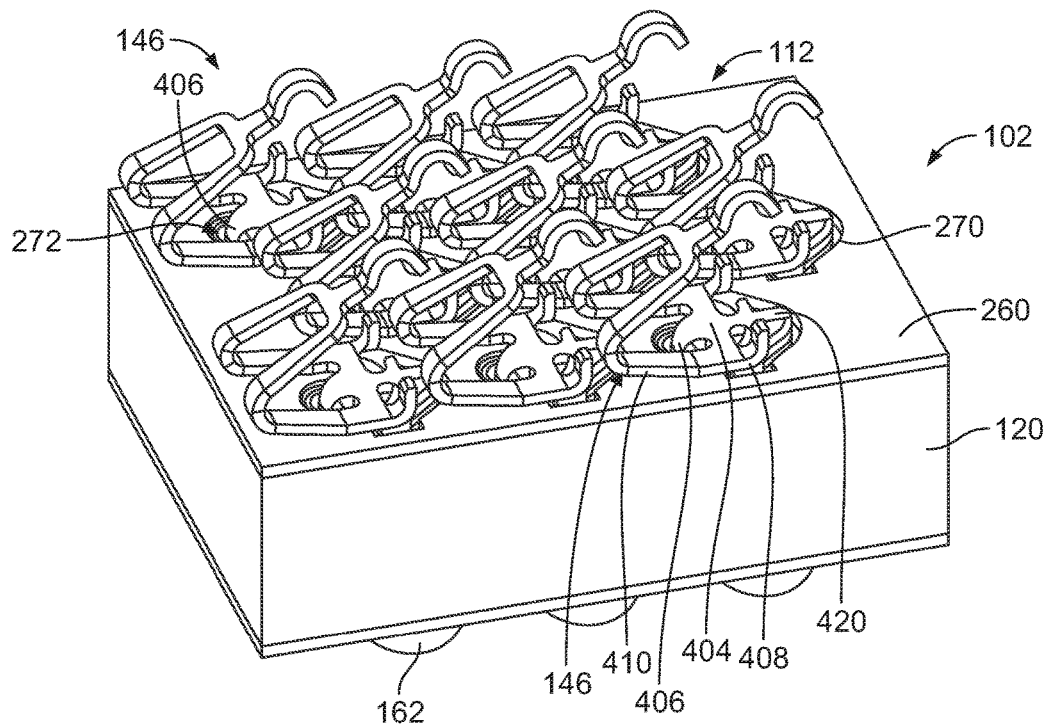
FIG. 21 is a top perspective view of the socket connector in accordance with an exemplary embodiment showing socket contacts mounted to the socket substrate.

FIG. 21 is a top perspective view of the socket connector 102 in accordance with an exemplary embodiment showing the socket contacts 146 mounted to the socket substrate 120. The socket contacts 146 are configured to be electrically connected to the BGA of solder balls 162 at the bottom of the socket substrate 120. However, some or all of the socket contacts 146 may be connected to other conductors, such as at the second upper mating area 114 (shown in FIG. 5).

In an exemplary embodiment, the socket contacts 146 are terminated to the upper contact pads 270 on the upper surface 260 at the first upper mating area 112. The compliant beams 406 are received in corresponding plated vias 272. The base 404 and/or the mating tabs 408, 420 are soldered to the upper contact pads 270. In an exemplary embodiment, having the spring beam 410 angled upward off of the upper surface 260 angles the spring beam 410 away from the solder of the socket contacts 146 behind the spring beam 410. As such, the spring beam 410 is not at risk of electrical shorting to the solder of the other socket contact 146 and/or the socket contacts 146 may be more densely populated on the socket substrate 120.

Figure 22:
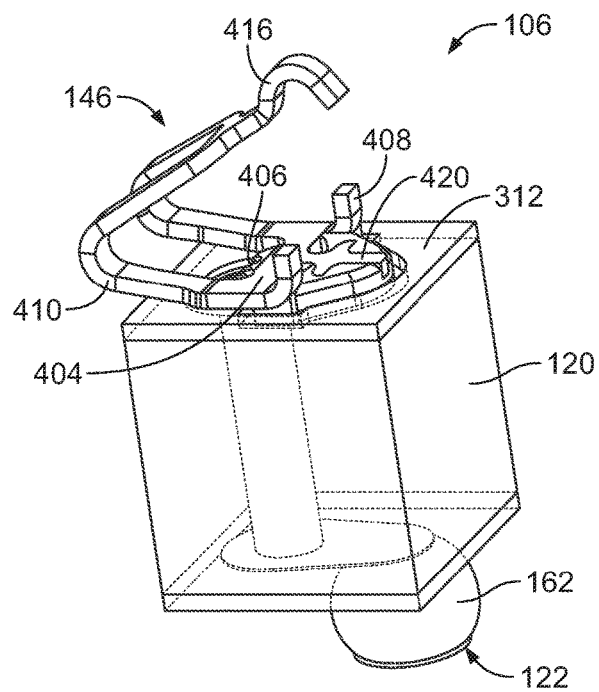
FIG. 22 is a perspective view of a portion of the socket assembly showing the socket contact coupled to the socket substrate.
Figure 23:
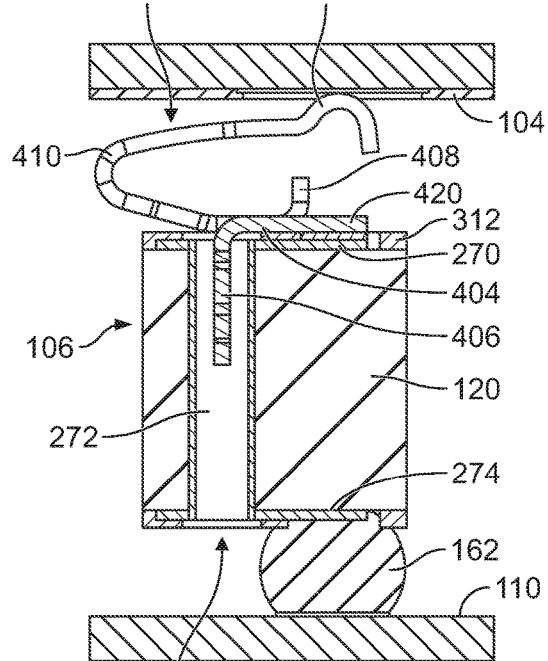
FIG. 23 is a cross-sectional view of a portion of the socket assembly showing the socket contact coupled to the socket substrate.

FIG. 22 is a perspective view of a portion of the socket assembly 106 showing the socket contact 146 coupled to the socket substrate 120. FIG. 23 is a cross-sectional view of a portion of the socket assembly 106 showing the socket contact 146 coupled to the socket substrate 120. The socket substrate conductor 122 includes the upper contact pad 270, the plated via 272 and the lower contact pad 274. The solder ball 162 is soldered to the lower contact pad 274.

The base 404 of the socket contact 146 is mounted to the upper surface 260 of the socket substrate 120. Optionally, the solder mask 312 or another layer may be provided at the upper surface 260. The mounting tabs 408 extend from the base 404 and are mounted to the socket substrate 120. The mounting tabs 408 may be soldered to the socket substrate 120. The mounting tab 420 extends from the base 404 and is mounted to the socket substrate 120. In an exemplary embodiment, the mounting tab 420 is soldered to the upper contact pad 270 to mechanically couple the socket contact 146 to the socket substrate 120 and electrically connect the socket contact 146 to the socket substrate conductor 122. The compliant beam 406 extends from the base 404 into the plated via 272. In an exemplary embodiment, the compliant beam 406 is press-fit in the plated via 272 to mechanically couple the socket contact 146 to the socket substrate 120 and electrically connect the socket contact 146 to the socket substrate conductor 122.

The spring beam 410 extends from the base 404 to position the mating beam 416 above the socket substrate 120 for electrically connecting to the electronic package 104 (shown in FIG. 5). The spring beam 410 is deflectable to compress the mating beam 416 toward the socket substrate 120. The socket contact 146 and the socket substrate conductor 122 form parts of the electrical path 292 between the electronic package 104 and the host circuit board 110 (shown in FIG. 5). For example, the electrical path 292 extends from the mating beam 416, through the spring beam 410, through the base 404, through the compliant beam 406 and/or the mounting tab 408, through the upper contact pad 270 and/or the plated via 272, through the lower contact pad 274 and through the solder ball 162. Any part of the electrical path 292 may be considered a socket substrate conductor 122 or the entire electrical path 292 may be considered a socket substrate conductor 122. For example, the upper contact pad 270 may be considered a socket substrate conductor 122 and/or the plated via 272 may be considered a socket substrate conductor 122 and/or the lower contact pad 274 may be considered a socket substrate conductor 122. As such, the socket contact 146 may be electrically connected to the host circuit board 110 by one or more socket substrate conductors 122.

Figure 24:
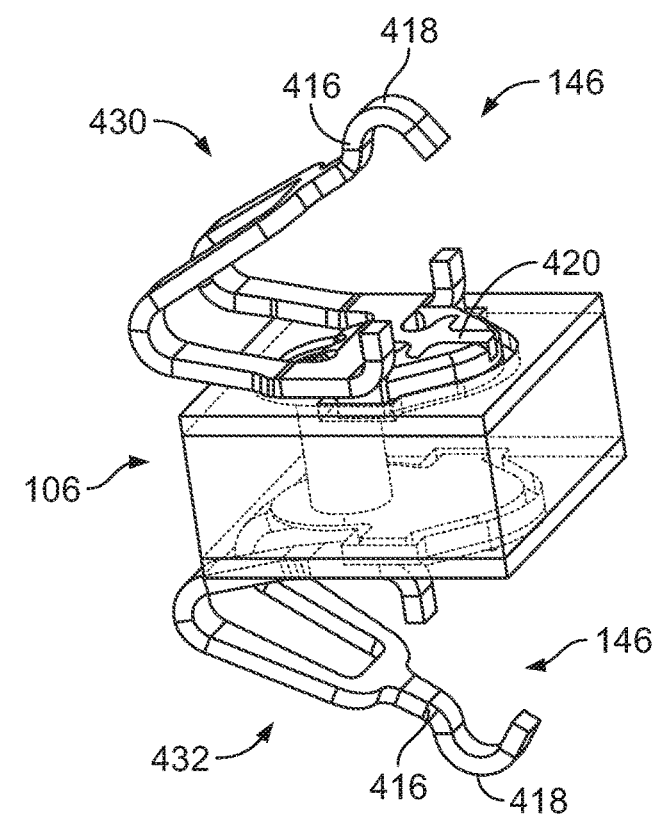
FIG. 24 is a perspective view of a portion of the socket assembly in accordance with an exemplary embodiment.
Figure 25:
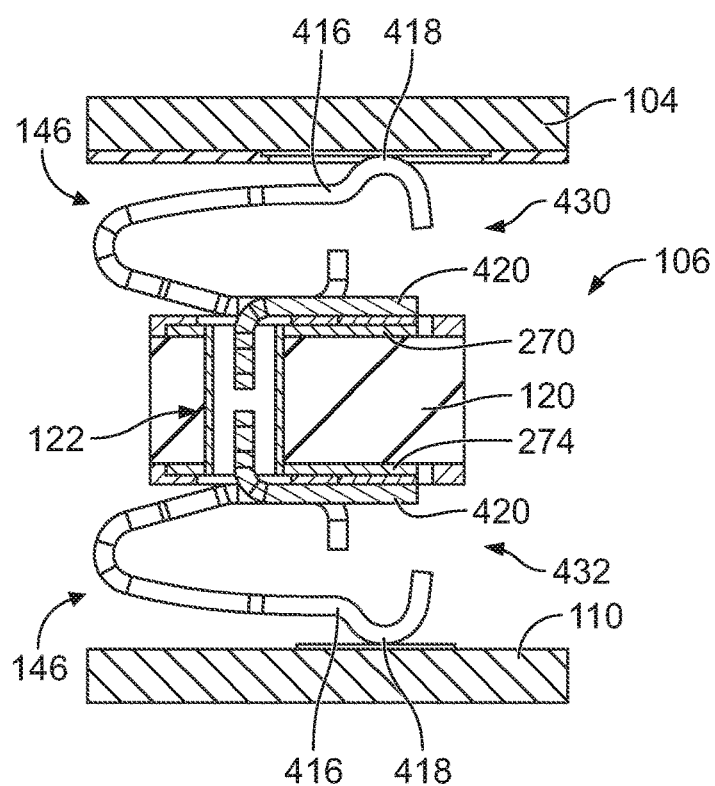
FIG. 25 is a cross-sectional view of a portion of the socket assembly in accordance with an exemplary embodiment.

FIG. 24 is a perspective view of a portion of the socket assembly 106 showing socket contacts 146 used as an upper socket contact 430 and a lower socket contact 432. FIG. 25 is a cross-sectional view of a portion of the socket assembly 106 showing the upper and lower socket contacts 430, 432. In an exemplary embodiment, the upper and lower socket contacts 430, 432 are identical. The upper socket contacts 430 form an array for mating with the electronic package 104 and the lower socket contacts form an array for mating with the host circuit board 110. The socket substrate conductor 122 includes the upper contact pad 270, the plated via 272 and the lower contact pad 274. In an exemplary embodiment, the mating beams 416 are oriented such that the mating interfaces 418 of the upper and lower socket contacts 430, 432 are aligned with each other. In an exemplary embodiment, the mating beams 416 are oriented such that the mating interfaces 418 of the upper and lower socket contacts 430, 432 are aligned with the mounting tabs 420. As such, the compressive forces of the upper and lower socket contacts 430, 432 are aligned along a vertical axis passing through the mounting tabs 420.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A socket connector for an electronic system comprising:
    a socket assembly comprising a socket substrate and socket contacts terminated to the socket substrate; the socket substrate having an upper surface and a lower surface, the socket substrate having a first upper mating area on the upper surface and a second upper mating area on the upper surface, the socket substrate having a first lower mating area on the lower surface, the socket substrate having socket substrate conductors on at least one layer of the socket substrate, first socket substrate conductors of the socket substrate conductors being at the first upper mating area, second socket substrate conductors of the socket substrate conductors being at the second upper mating area and being electrically connected to corresponding first socket substrate conductors, and third socket substrate conductors of the socket substrate conductors being at the first lower mating area and being electrically connected to corresponding first socket substrate conductors, the first socket substrate conductors configured to be electrically connected to an electronic package mated to the first upper mating area, the second socket substrate conductors configured to be electrically connected to an electrical component mated to the second upper mating area, the third socket substrate conductors configured to be electrically connected to a host circuit board mated to the first lower mating area; and
    the socket contacts each having a base, a terminating end extending from the base and a mating end extending from the base, the terminating end being terminated to corresponding first socket substrate conductors, the mating end having a spring beam deflectable relative to the base and a mating beam at a distal end of the spring beam, the mating beam having a separable mating interface configured to be terminated to corresponding package contacts of the electronic package, wherein the base has a front and a rear, the spring beam extending rearward from the base and upward at an angle to elevate the mating end above the base, the mating beam extending forward form the spring beam, the socket contact having a mounting tab extending from the front of the base, the mounting tab configured to be soldered to corresponding upper contact pads on the upper surface defining the first socket substrate conductors to mechanically secure the mounting tab to the socket substrate, wherein the separable mating interface of the mating beam is aligned vertically above the mounting tab, the terminating ends of at least a plurality of the socket contacts each include a compliant beam extending from a rear of the base, the compliant beam being press-fit into corresponding plated vias of the socket substrate defining the first socket substrate conductors;
    wherein the socket assembly is configured to electrically connect the electronic package with both the host circuit board and the electrical component through corresponding socket substrate conductors.

2. The socket connector of claim 1, wherein at least a plurality of the plated vias being back drilled and extending only partially through the socket substrate ending remote from the lower surface.

3. The socket connector of claim 1, wherein the socket contacts comprise first socket contacts and second socket contacts, the first socket contacts comprising compliant beams at the terminating ends extending into corresponding plated vias of the socket substrate defining corresponding first socket substrate conductors, the second socket contacts comprising mounting tabs at the terminating ends soldered to corresponding upper contact pads on the upper surface defining corresponding first socket substrate conductors, the mating ends of the first and second socket contacts being coplanar for mating with the electronic package.

4. The socket connector of claim 1, wherein the second socket substrate conductors extend to the upper surface at the second upper mating area and the third socket substrate conductors extend to the lower surface at the first lower mating area.

5. The socket connector of claim 1, wherein the second socket substrate conductors comprise circuit traces on at least one layer of the socket substrate routed between the first upper mating area and the second upper mating area.

6. The socket connector of claim 1, wherein the third socket substrate conductors comprise plated vias routed between the first upper mating area at the upper surface and the first lower mating area at the lower surface and the third socket substrate conductors comprise lower contact pads on the lower surface electrically connected to corresponding plated vias and configured to be electrically connected to the host circuit board by a ball grid array of solder balls.

7. The socket connector of claim 1, wherein the socket assembly comprises a socket frame holding the socket substrate, the socket frame having frame walls surrounding a socket frame opening configured to receive the electronic package.

8. The socket connector of claim 1, wherein the socket substrate conductors comprise forth socket substrate conductors extending between the second upper mating area and a second lower mating area on the lower surface, the fourth socket substrate conductors configured to electrically connect the electrical component and the host circuit board.

9. A socket connector for an electronic system comprising:
a socket assembly comprising a socket substrate and socket contacts terminated to the socket substrate;
the socket substrate having an upper surface and a lower surface, the socket substrate having a first upper mating area on the upper surface and a first lower mating area on the lower surface, the socket substrate having socket substrate conductors on at least one layer of the socket substrate, wherein first socket substrate conductors of the socket substrate conductors comprising plated vias extending between the first upper mating area and the first lower mating area and the first socket substrate conductors comprising lower contact pads at the first lower mating area electrically connected to the corresponding plated vias, the lower contact pads configured to be electrically connected to a host circuit board by a ball grid array of solder balls, and wherein second socket substrate conductors of the socket substrate conductors comprising upper contact pads and circuit traces electrically connected to corresponding upper contact pads and routed remote from the first upper mating area for electrical connection to an electrical component remote from the first upper mating area; and
the socket contacts each having a base, a terminating end extending from the base and a mating end extending from the base, the terminating end being terminated to corresponding socket substrate conductors, the mating end having a spring beam deflectable relative to the base and a mating beam at a distal end of the spring beam, the mating beam having a separable mating interface configured to be terminated to corresponding package contacts of the electronic package, wherein the first socket substrate conductors electrically connect the electronic package to the host circuit board and the second socket substrate conductors electrically connect the electronic package to the electrical component,
wherein the base has a front and a rear, the spring beam extending rearward from the base and upward at an angle to elevate the mating end above the base, the mating beam extending forward form the spring beam, the socket contact having a mounting tab extending from the front of the base, the mounting tab being cross shaped, the mounting tab configured to be soldered to a contact pad on the upper surface to mechanically secure the mounting tab to the socket substrate, wherein the separable mating interface of the mating beam is aligned vertically above the mounting tab.

10. The socket connector of claim 9, wherein the socket contacts comprise first socket contacts and second socket contacts, the first socket contacts being terminated to corresponding first socket substrate conductors, the first socket contacts comprising compliant beams at the terminating ends extending into corresponding plated vias of the socket substrate, the second socket contacts being terminated to corresponding second socket substrate conductors, the second socket contacts comprising mounting tabs at the terminating ends soldered to corresponding upper contact pads.

11. The socket connector of claim 9, wherein the socket substrate includes a second upper mating area on the upper surface remote from the first upper mating area receiving the electrical component, the second socket substrate conductors extending between the first upper mating area and the second upper mating area to electrically connect the electronic package and the electrical component.

12. The socket connector of claim 9, wherein the terminating ends of at least a plurality of the socket contacts each include a compliant beam extending from the base into corresponding plated vias of the socket substrate.

13. The socket connector of claim 9, wherein the second socket substrate conductors comprise plated vias electrically connected to corresponding circuit traces, the terminating ends of at least a plurality of the socket contacts have compliant beams press-fit in corresponding plated vias of the second socket substrate conductors, the plated vias of the second socket substrate conductors being back drilled and extending only partially through the socket substrate ending remote from the lower surface.

14. An electronic system comprising:
a host circuit board having host contacts;
an electronic package having a substrate including package contacts and an electronic component on the substrate electrically connected to the package contacts; and
a socket connector for electrically connecting the electronic package with the host circuit board, the socket connector comprising a socket assembly and an electrical component, the socket assembly including a socket substrate and socket contacts, the socket substrate having socket substrate conductors, the socket contacts each having a base, a terminating end extending from the base and a mating end extending from the base, the terminating end being terminated to corresponding socket substrate conductors, the mating end having a spring beam deflectable relative to the base and a mating beam at a distal end of the spring beam, the mating beam having a separable mating interface configured to be terminated to corresponding package contacts of the electronic package, wherein first socket substrate conductors of the socket substrate conductors electrically connect the electronic package to the host circuit board and wherein second socket substrate conductors of the socket substrate conductors electrically connect the electronic package to the electrical component;

wherein the base has a front and a rear, the spring beam extending rearward from the base and upward at an angle to elevate the mating end above the base, the mating beam extending forward form the spring beam, the socket contact having a mounting tab extending from the front of the base, the mounting tab configured to be soldered to a solder pad of the corresponding first socket substrate conductor to mechanically secure the mounting tab to the socket substrate, wherein the separable mating interface of the mating beam is aligned vertically above the mounting tab, the terminating ends of at least a plurality of the socket contacts each include a compliant beam extending from a rear of the base, the compliant beam being press-fit into corresponding plated vias of the socket substrate defining the first and second socket substrate conductors.

15. The electronic system of claim 14, wherein the socket contacts comprise first socket contacts and second socket contacts, the first socket contacts comprising compliant beams at the terminating ends extending into corresponding plated vias of the socket substrate defining corresponding socket substrate conductors, the second socket contacts comprising mounting tabs at the terminating ends soldered to corresponding upper contact pads on the upper surface defining corresponding socket substrate conductors, the mating ends of the first and second socket contacts being coplanar for mating with the electronic package.

16. A socket contact for a socket connector, the socket contact comprising:
a base having a front and a rear;
a mating end extending from the base, the mating end having a spring beam deflectable relative to the base, the spring beam extending rearward from the base and upward at an angle to elevate the mating end above the base, the mating end having a mating beam extending forward form the spring beam, the mating beam having a separable mating interface configured to be terminated to a package contact of an electronic package;
a mounting tab extending from the front of the base, the mounting tab configured to be soldered to a solder pad of a socket substrate to mechanically secure the mounting tab to the socket substrate, and
a compliant beam extending from the rear of the base, the compliant beam configured to be press fit in a via of the socket substrate;
wherein the mating interface is aligned vertically above the mounting tab.

17. The socket contact of claim 16, wherein the mounting tab includes stabilizing arms extending therefrom to prevent rolling of the socket contact.

18. A socket contact for a socket connector, the socket contact comprising:
a base having a front and a rear;
a mating end extending from the base, the mating end having a spring beam deflectable relative to the base, the spring beam extending rearward from the base and upward at an angle to elevate the mating end above the base, the mating end having a mating beam extending forward form the spring beam, the mating beam having a separable mating interface configured to be terminated to a package contact of an electronic package;
a mounting tab extending from the front of the base, the mounting tab configured to be soldered to a solder pad of a socket substrate to mechanically secure the mounting tab to the socket substrate, wherein the mounting tab is cross-shaped,
wherein the mating interface is aligned vertically above the mounting tab.

19. The socket contact of claim 18, further comprising a compliant beam extending from the rear of the base, the compliant beam configured to be press fit in a via of the socket substrate.

20. The socket connector of claim 1, wherein the mounting tab includes stabilizing arms extending therefrom to prevent rolling of the socket contact.

21. The socket connector of claim 1, wherein the mounting tab is cross-shaped.

22. The socket connector of claim 1, wherein data signals are transmitted between the first and second socket substrate conductors.

23. The socket connector of claim 1, wherein power is transmitted between the first and second socket substrate conductors.

24. The socket connector of claim 9, wherein the mounting tab includes stabilizing arms extending therefrom to prevent rolling of the socket contact.

25. The electronic system of claim 14, wherein the mounting tab includes stabilizing arms extending therefrom to prevent rolling of the socket contact.

26. The electronic system of claim 14, wherein the mounting tab is cross-shaped.

* * * * *